United States Patent
Lee et al.

(10) Patent No.: US 11,112,301 B2
(45) Date of Patent: Sep. 7, 2021

(54) METHOD FOR CORRECTING OPTICAL SENSOR ARRAY MODULE THROUGH CHARACTERISTIC EVALUATION

(71) Applicant: SOL INC., Seoul (KR)

(72) Inventors: Jong Muk Lee, Seoul (KR); Tae Young Lee, Asan-si (KR); Jae In Kim, Seoul (KR)

(73) Assignee: SOL INC., Seoul (KR)

( * ) Notice: Subject to any disclaimer, the term of this patent is extended or adjusted under 35 U.S.C. 154(b) by 619 days.

(21) Appl. No.: 15/577,586

(22) PCT Filed: Jun. 9, 2016

(86) PCT No.: PCT/KR2016/006109
§ 371 (c)(1),
(2) Date: Nov. 28, 2017

(87) PCT Pub. No.: WO2016/200166
PCT Pub. Date: Dec. 15, 2016

(65) Prior Publication Data
US 2018/0164158 A1    Jun. 14, 2018

(30) Foreign Application Priority Data

Jun. 9, 2015 (KR) .................. 10-2015-0081134
Dec. 28, 2015 (KR) .................. 10-2015-0187389

(51) Int. Cl.
*G01J 1/44* (2006.01)
*H04N 5/374* (2011.01)
(Continued)

(52) U.S. Cl.
CPC ............ *G01J 1/44* (2013.01); *G01N 21/6428* (2013.01); *G01N 21/6458* (2013.01);
(Continued)

(58) Field of Classification Search
CPC ........ G01J 1/44; H04N 5/3651; H04N 5/3653; H04N 5/3655; H01L 27/146; G01N 21/64
See application file for complete search history.

(56) References Cited

U.S. PATENT DOCUMENTS

| | | | |
|---|---|---|---|
| 2005/0128475 A1* | 6/2005 | Imura | .................. G01J 1/08 356/300 |
| 2009/0153873 A1* | 6/2009 | Chan | .................. G01B 9/02014 356/495 |
| 2011/0176709 A1* | 7/2011 | Park | .................. G06T 7/521 382/106 |

FOREIGN PATENT DOCUMENTS

| | | |
|---|---|---|
| KR | 10-2008-0061052 A | 7/2008 |
| KR | 10-2011-0085785 A | 7/2011 |
| KR | 10-2013-0040026 A | 4/2013 |

* cited by examiner

Primary Examiner — Regis J Betsch
Assistant Examiner — Jeremy A Delozier
(74) Attorney, Agent, or Firm — Studebaker & Brackett, PC

(57) ABSTRACT

The present invention relates to a method for correcting a packaged optical sensor array module, and the method for correcting a packaged optical sensor array module according to the present invention comprises the steps of: analyzing statistical characteristics of an optical sensor array with respect to light emitted from a standard light source having a predetermined characteristic value to extract a representative value, and calculating a first correction value for a measurement value according to the extracted representative value; and calculating a second correction value for a measured value of the optical sensor array that is corrected by the first correction value with respect to light emitted from an applied light source or light emitted by a fluorescence of the applied light source.

9 Claims, 18 Drawing Sheets

(51) Int. Cl.
*H04N 5/357* (2011.01)
*H04N 5/365* (2011.01)
*H01L 27/146* (2006.01)
*G01N 21/64* (2006.01)

(52) U.S. Cl.
CPC ........... *H01L 27/146* (2013.01); *H04N 5/357* (2013.01); *H04N 5/3651* (2013.01); *H04N 5/3653* (2013.01); *H04N 5/3655* (2013.01); *H04N 5/374* (2013.01); *G01J 2001/444* (2013.01); *G01N 2201/062* (2013.01)

| PIXEL OUTPUT VALUE(Digital Number) | REPRESENTATIVE VALUE |
|---|---|
| 1~29 | NO EFFECTIVE AREA |
| 30~37 | $M_1$ |
| 38~47 | $M_2$ |
| ~ | ~ |
| ~ | ~ |
| 100~110 | $M_{50}$ |
| ~ | ~ |
| 225~235 | $M_{100}$ |
| 236~255 | NO EFFECTIVE AREA |

METHOD FOR CORRECTING OPTICAL SENSOR ARRAY MODULE THROUGH CHARACTERISTIC EVALUATION

CROSS-REFERENCE TO RELATED APPLICATIONS

This application is a national stage of International Application No. PCT/KR2016/006109, filed Jun. 9, 2016, which claims the benefit of priority to Korean Application No. 10-2015-0081134, filed Jun. 9, 2015 and Korean Application No. 10-2015-0187389, filed Dec. 28, 2015, both filed in the Korean Intellectual Property Office, the disclosures of which are incorporated herein in their entireties by reference.

BACKGROUND

1. Technical Field

The present invention relates to a method for correcting a packaged optical sensor array module through characteristic evaluation of an optical sensor array.

2. Description of the Related Art

The largest application fields of image sensors (e.g., a charge-coupled device (CCD) image sensor and a complementary metal-oxide-semiconductor (CMOS) image sensor) are in the smartphone and digital camera market. A structure of a camera module includes an external optical lens, an infrared (IR) filter, and an image sensor. In a color filter layer inside a conventional CMOS or CCD image sensor, red (R), green (G), and blue (B) filters are arranged with a predetermined pattern for each pixel, and the pattern is 50% G, 25% R, and 25% B, which are alternately arranged according to human visual characteristics. Such a pattern is called a Bayer pattern. As described above, each pixel of an actual image sensor can sense only one of R, G, and B colors, but in a camera image we see, all of the R, G, and B colors are shown for each pixel. This is possible because color values of peripheral cells of each of the pixels are interpolated in software to form a color. Various algorithms such as a standard evaluation method of the International Organization for Standardization (ISO), image signal processing, and the like have been developed for characteristic evaluation of an image and a correction method of an image.

However, recently, with the development of sensor technology, cases in which each of optical sensor arrays without external optical lenses is applied as a measuring instrument are being increased. Specifically, the optical sensor arrays are used for a bio-photoreaction measuring instrument, a lens-free microscope, an in vitro diagnostic device using photoreaction measurement of immunochromatography, a multiplexing device for deoxyribonucleic acid (DNA) analysis, a bio-signal measuring instrument for healthcare, an implantable or patch-type medical measuring instrument, and the like. However, generally, characteristics of image sensors produced in semiconductor fabrication plants are different at each sensor position in a wafer, and characteristics are different in each pixel even in the same sensor.

Meanwhile, technique for measuring a degree to which responsivity (or response) of an image sensor itself varies according to each pixel, that is, spatial uniformity of a response, with high accuracy leaves much to be desired. This is because spatial uniformity of a response of an image sensor used in a general camera is acquired as an image and evaluated in a digital signal processing part in a finished product stage in which a lens is mounted, and accurate measurement in a sensor stage is necessary in only very limited cases, such as quality control in a production process and the like. However, in an application field such as a biochip or the like in which an image sensor itself is used as a measuring instrument, it is very important and necessary that uniformity of responsivity for each pixel is measured and corrected in the sensor stage.

Specifically, optical sensor arrays are being increasingly used for a bio-photoreaction measuring instrument, a lens-free microscope, an in vitro diagnostic device using a photoreaction measurement of immunochromatography, a multiplexing device for DNA analysis, a bio-signal measuring instrument for healthcare, an implantable or patch-type medical measuring instrument, and the like.

Therefore, reliability of measurement accuracy of each pixel of an optical sensor array is an important issue in these diagnostic devices. It is necessary to improve the accuracy through an appropriate measurement set-up, an array characteristic test method, and correction.

SUMMARY

Technical Problem

The present invention is directed to providing a method of calculating a reliable measurement value by, depending on various conditions, proposing a correction reference for characteristics of all pixels of an optical sensor array, which is applied to fields in which reliability for measurement accuracy is important, under a standard light source environment and an actually applied application light source environment.

The present invention is also directed to providing a method of calculating a more reliable measurement value by proposing an error correction value according to an intermediate layer stacked on an optical sensor array.

The present invention is also directed to providing a method in which measured values, correction coefficients, and major characteristic values are listed in data such that a user who desires to use a sensor can recognize an error range of measurement result values, and thus errors of important determination can be reduced, and reliability can be increased.

Solution to Problem

One aspect of the present invention provides a method for correcting a packaged optical sensor array module including analyzing statistical characteristics of an optical sensor array with respect to light emitted from a standard light source having a predetermined characteristic value to extract a representative value, and calculating a first correction value for a measurement value according to the extracted representative value, and calculating a second correction value for a measurement value of the optical sensor array that is corrected by the first correction value with respect to light emitted from an applied light source or light emitted by a fluorescence reaction of the applied light source.

Another aspect of the present invention provides a method for correcting an optical sensor array through characteristic evaluation including receiving a collected characteristic value of an optical sensor array with respect to a standard light source having a predetermined characteristic value and extracting a first correction value of the collected characteristic value, receiving a collected characteristic value of the optical sensor array with respect to a light source in an application environment and extracting a second correction value of the collected characteristic value of the light source in the application environment, and calculating a correction value for the application environment of the optical sensor array using the first correction value and the second correction value.

The extracting of the first correction value may include extracting a planarization correction value for planarizing the collected characteristic value of the optical sensor array according to a wavelength change of the standard light source, and extracting a linearization correction value for linearizing the collected characteristic value of the optical sensor array according to an intensity change of the standard light source.

The extracting of the second correction value may include extracting a planarization correction value for planarizing the collected characteristic value of the optical sensor array according to an applied wavelength of the light source in the application environment, and extracting a linearization correction value for linearizing the collected characteristic value of the optical sensor array according to an applied intensity of the light source in the application environment.

In the extracting of the second correction value, an amount of light of the standard light source may be set to be a target amount of light, and an exposure time of the optical sensor array in the application environment determined according to the target amount of light or a collected characteristic value according to a gain may be input.

Still another aspect of the present invention provides a method for diagnosis through an optical sensor array including receiving a collected characteristic value collected in the optical sensor array with respect to a light source in an application environment, and receiving a reaction characteristic value collected in the optical sensor array, which reacts with a material to be reacted, with respect to the light source in the application environment, wherein the optical sensor array collects a corrected characteristic value using a first correction value of the collected characteristic value extracted by receiving the collected characteristic value of the optical sensor array with respect to a standard light source having a predetermined characteristic value and a second correction value of the characteristic value of the light source in the application environment extracted by receiving the collected characteristic value of the optical sensor array with respect to the light source in the application environment.

DETAILED DESCRIPTION OF EMBODIMENTS

The following content merely illustrates principles of the invention. Therefore, those skilled in the art should be able to devise various devices which, although not explicitly described or illustrated herein, embody the principles of the invention and are included in the concept and scope of the invention. It should be understood that all conditional terms and embodiments used herein are, in principle, expressly intended for the purpose of enabling the inventive concept to be understood and are not to be construed as limited to specifically stated embodiments and conditions.

Purposes, specific advantages, and novel features of the invention should become clear through the following detailed descriptions in connection with the accompanying drawings. Therefore, the technological scope of the invention can be easily performed by those skilled in the art.

In descriptions of the invention, when it is determined that detailed descriptions of related well-known functions unnecessarily obscure the gist of the invention, the detailed descriptions will be omitted. Hereinafter, an embodiment of the present invention will be described in detail with reference to the accompanying drawings.

First, a method for correcting a packaged optical sensor array module will be described. First, a measurement environment in which measurement for a correction of a packaged optical sensor array module according to the present embodiment is performed will be described with reference to the drawings.

Figure 1:
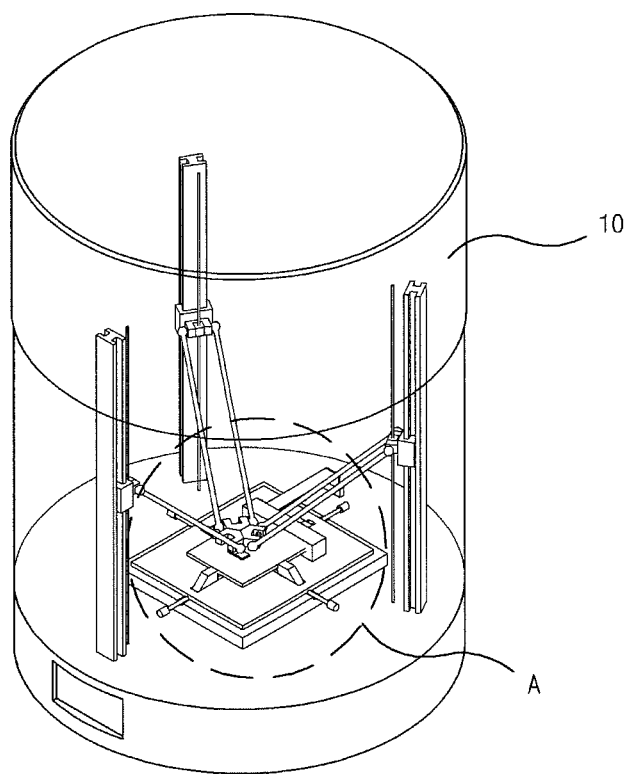
FIGS. 1 and 2 are views illustrating a measurement environment for calculating a correction value of a packaged optical sensor array module according to an embodiment of the present invention.
Figure 2:
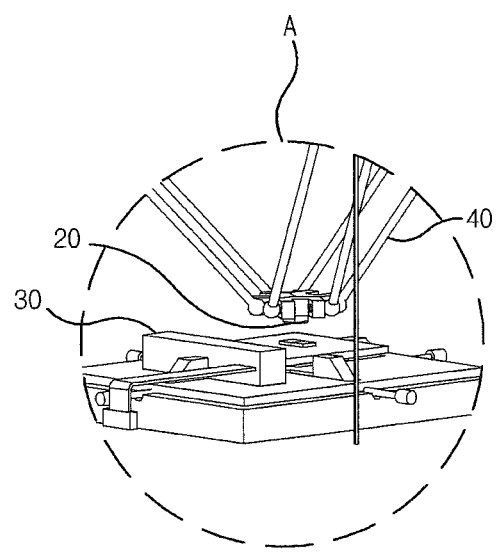

FIGS. 1 and 2 are views illustrating a measurement environment for calculating a correction value of a packaged optical sensor array module according to the embodiment of the present invention.

Referring to FIG. 1, the measurement environment may be an environment in which introduction of external light is prevented through a darkroom configuration 10. Therefore, a measurement device may be sealed with a housing.

The measurement device will be described in detail with reference to FIG. 2.

FIG. 2 is an enlarged view of region A in FIG. 1.

Referring to FIG. 2, in the present embodiment, an optical sensor array 30 is arranged to be perpendicular to a light source. In the present embodiment, a light source which satisfies spatial uniformity approved by an accredited certification authority is referred to as a standard light source 20. For example, spatial uniformity of the standard light source should be within a uniformity of 0.1% of a total area of an optical sensor array and within a uniformity of 0.5% over time. A light source which maintains uniformity within 1% of an amount of light corresponding to one code of a pixel output value may be used as the standard light source.

In the present embodiment, an applied light source refers to a light source in an environment to which an actual optical sensor array is applied.

In the present embodiment, the applied light source includes a light-emitting source (a light-emitting diode (LED), an organic LED (OLED), a chemical light-emitting source, a laser, or the like) which emits light, a fluorescent light source which receives light energy from the light-emitting source and emits new light in response thereto, and the like. The present invention includes an embodiment in which intensity of emitted light or fluorescent light or a degree of transmission or absorption of a light source through an intermediate medium is measured.

Since the optical sensor array according to the present embodiment does not include an external lens as a configuration for collecting a characteristic value of light emitted from a light source, a distance between the light source and the sensor array may act as a parameter which affects characteristic evaluation.

In this case, the distance may be calculated in consideration of geometrical characteristics such as the presence or absence of a micro lens in the sensor array itself, and a correction value according to the calculated distance may be set as a correction parameter. In addition, the optical sensor array may include a jig configuration 40 for aligning a distance from an optical axis of the light source or a distance from the sensor array. When the distance from the optical axis is set, a test for calculating a correction value is performed.

For example, in the present embodiment, in order to perform the measurement, it is necessary for parameters which affect the measurement value to be initially set through the above-described configuration.

For example, when an LED is used as the light source 20, since efficiency of the LED is influenced by temperature, a thermoelectric cooler (TEC) may be applied to a substrate on which the LED is mounted to maintain a constant temperature to maintain temperature uniformity.

In order to implement brightness uniformity of LED, automatic power control (APC) may be implemented as a feedback circuit in an LED circuit, and incoming power may be controlled to achieve a constant brightness.

Further, the method may further include a step of aligning an optical axis of the light emitted from the light source in addition to the above-described setting of the uniformity of the light source. Specifically, in the present embodiment, an optical axis of parallel light of the light source may be aligned to be perpendicular to a sensor surface. A microelectromechanical systems (MEMS) grating may be used as a method of determining whether the optical axis is aligned.

For example, the MEMS grating is formed in a test environment, a wavelength of light reflected through the MEMS grating is determined, only light which is vertically incident is extracted therefrom, and the light may be used for the measurement.

Light emitted from the above-described LED is incident on a mirror attached to a fixed stage jig through one optical axis and reflected by a reference mirror, the light reflected from the mirror of the stage jig and the light reflected from the reference mirror separated from one light source are compared and analyzed, and displacement and angle changes of the light may be simultaneously measured by a Michel's interferometer that can detect a back and forth moving distance thereof and an auto collimator that analyzes a position at which the light reflected from the stage mirror is incident.

Accordingly, only vertically incident light is extracted by adjusting a displacement and angle of the incident light or only light within a predetermined displacement and angular range according to conditions may be extracted and used for the measurement. The measured displacement or angle may be used for extracting a correction value according to a distance difference between the sensor and the light source, which is illustrated in Table 1 to be described later. Furthermore, a diffuser, a parallel optical lens, or the like may be combined to form physical spatial parallel light.

As another embodiment of the present invention, when the light emitted from the applied light source is emitted through a fluorescence reaction or a transmission reaction, a configuration for controlling a wavelength or intensity of the light source may be additionally provided for uniformity of the light source.

A dimmer circuit may be additionally provided to adjust intensity of the light source.

For example, when an initial setting of the above-described parameters which affect the measurement values, such as the distance from the light source, the temperature, the optical axis, and the like, is completed, output code values of all pixels are read as characteristic values while setting the wavelength of the light source and increasing the intensity of the light source at uniform intervals.

Figure 3:
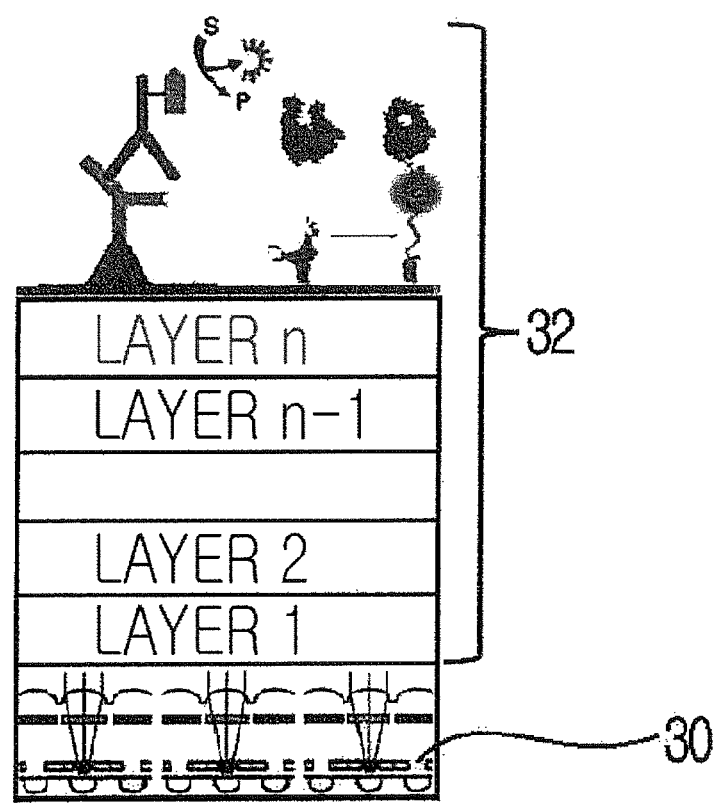
FIG. 3 is a view illustrating a state in which intermediate layers of an optical sensor array corrected according to an embodiment of the present invention are stacked.

Referring to FIG. 3, the optical sensor array according to the present embodiment may further include a plurality of intermediate layers 32 on an upper portion thereof.

In an application environment according to the present embodiment, the optical sensor array has the plurality of intermediate layers bonded to the upper portion thereof, and thus collected characteristic values may be values collected through the intermediate layers.

In the present embodiment, the intermediate layers include all of a reactive material layer and a physical space through which light travels as well as a medium constituted between the applied light source and the optical sensor array.

In the correction method according to the present embodiment, measurement is performed in both a case in which a single optical sensor array is provided in an environment with no intermediate layer and a case in which a plurality of intermediate layers are formed as cases in which the physical space is within a negligible range so that correction values corresponding thereto are calculated.

Hereinafter, a method for correcting an optical sensor array performing calculation of a correction value in the above-described environment will be described with reference to FIG.

Figure 4:
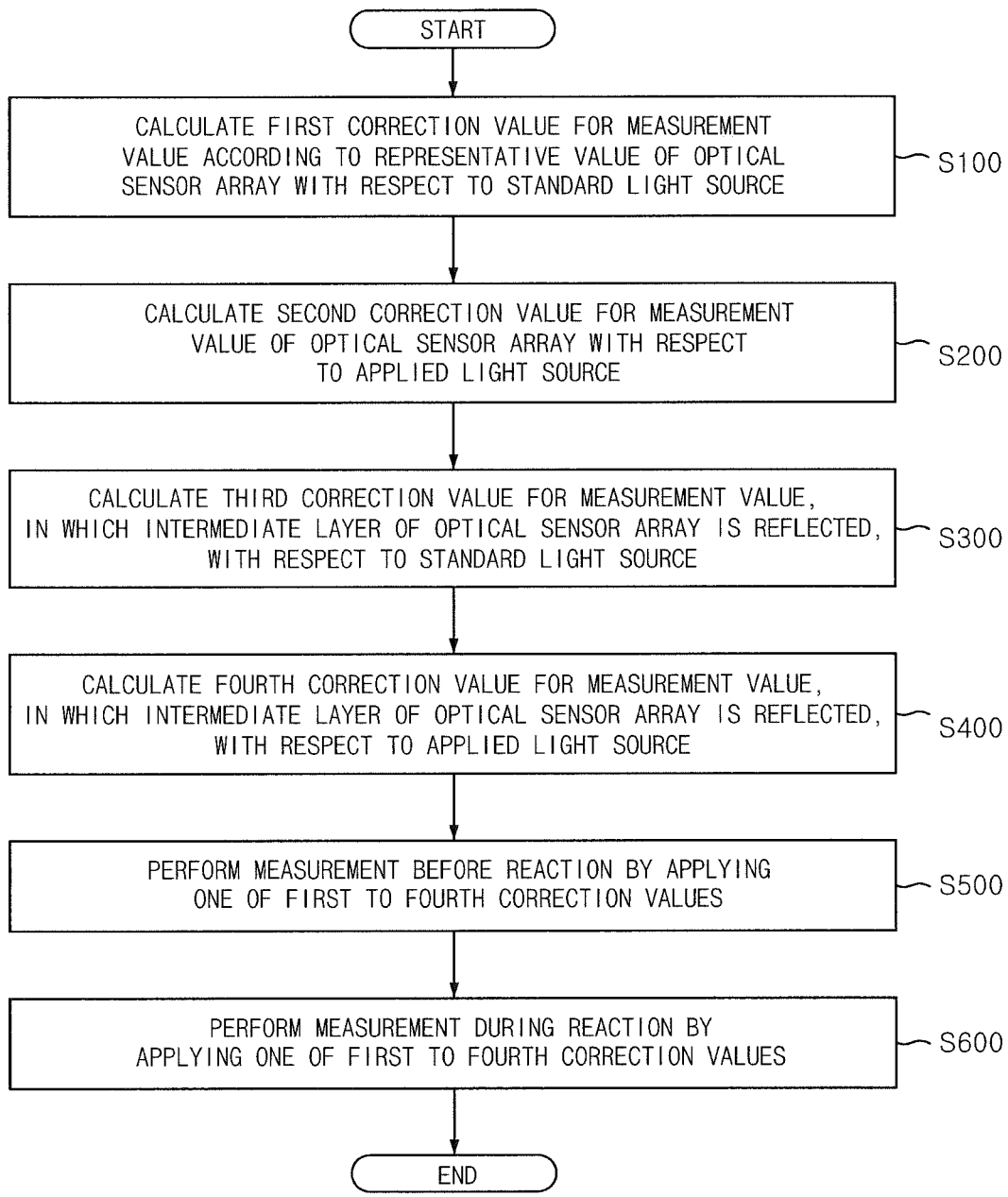
FIG. 4 is a flowchart of a method for correcting a packaged optical sensor array module according to an embodiment of the present invention.

The method for correcting an optical sensor array according to the present embodiment may be performed as illustrated in FIG. 4.

Referring to FIG. 4, the method for correcting an optical sensor array according to the present embodiment includes a first correction value calculating step (S100), a second correction value calculating step (S200), a third correction value calculating step (S300), and a fourth correction value calculating step (S400).

Among the above steps, the first and second correction value calculating steps correspond to correcting steps for the optical sensor array before the intermediate layers are mounted on the optical sensor array (before being packaged), and the third and fourth correction value calculating steps correspond to correcting steps for the packaged optical sensor array after the intermediate layers are mounted thereon.

In the first correction value calculating step (S100) according to the present embodiment, statistical characteristics of a measurement value of the optical sensor array with respect to light emitted from a standard light source having a predetermined characteristic value are analyzed to extract a representative value, and a first correction value for a measurement value according to the extracted representative value is calculated.

In the first correction value calculating step (S100) according to the present embodiment, the first correction value of the optical sensor array regarding a standard light source in a darkroom box is calculated.

The measurement performed in the present embodiment may be performed by adjusting at least one of an exposure time, an analog gain, a digital gain, and a frame rate.

Specifically, the measured measurement value may be a value which is collected in the optical sensor array according to intensity or a wavelength of the light emitted from the light source.

In the present embodiment, the measurement value may be a value which is determined using a difference between a plurality of values which are collected N times or a difference between a reference offset value and the collected values by fixing the intensity and the wavelength of the light emitted from the light source.

Figure 5A:
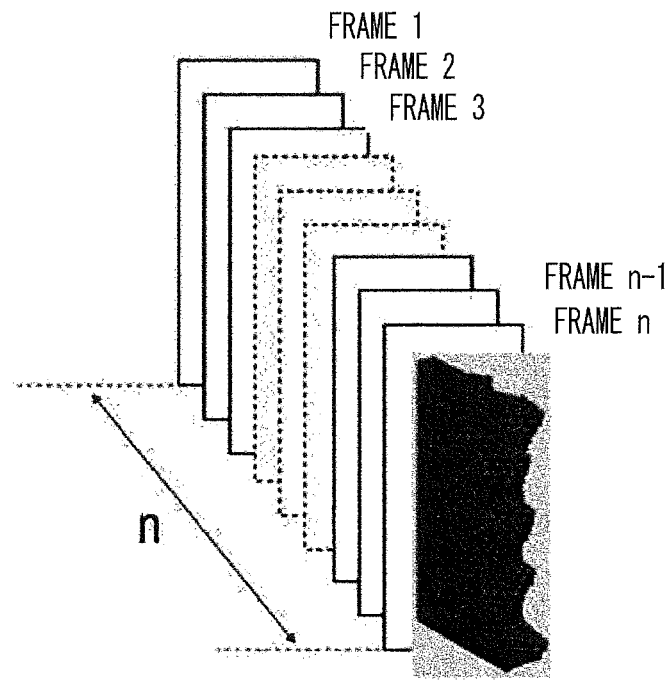
FIGS. 5A to 9 are views for describing some processes of a method for correcting a packaged optical sensor array module according to an embodiment of the present invention.
Figure 5B:
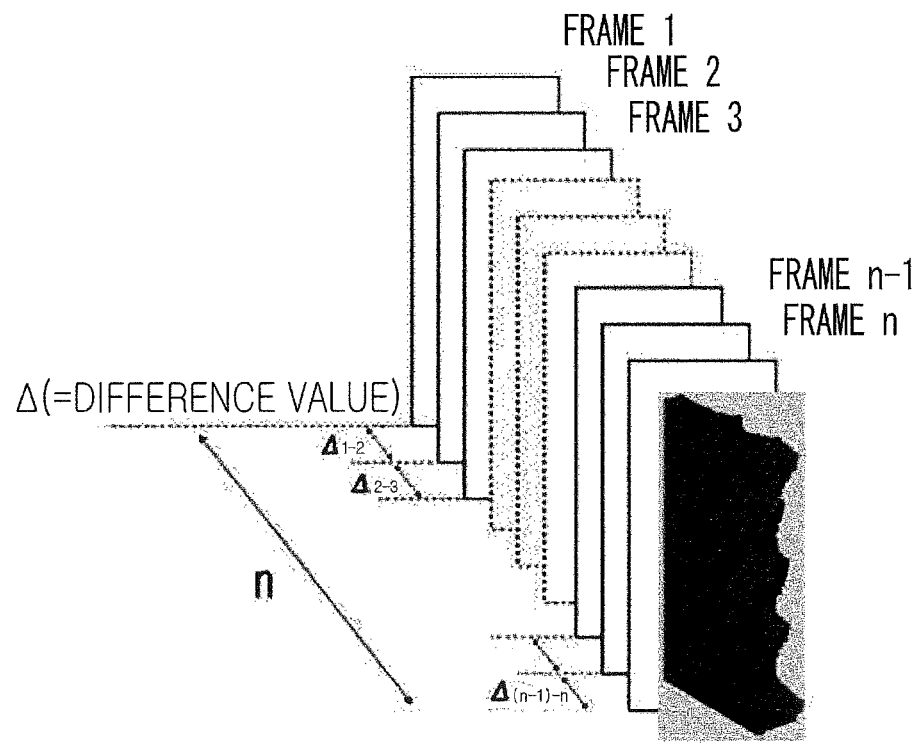

For example, the measurement value may be calculated through a measurement by being measured N times according to the determined frame rate, as illustrated in FIG. 5A. A difference between measurement values in consecutive frames among a series of the values measured N times may be calculated, as illustrated in FIG. 5B. Further, a difference between a plurality of measured values may be calculated using a value measured in the optical sensor array as the reference offset value without the light source being operated in a dark frame, and a noise value included in the measured value may be calculated using the difference value.

Figure 6:
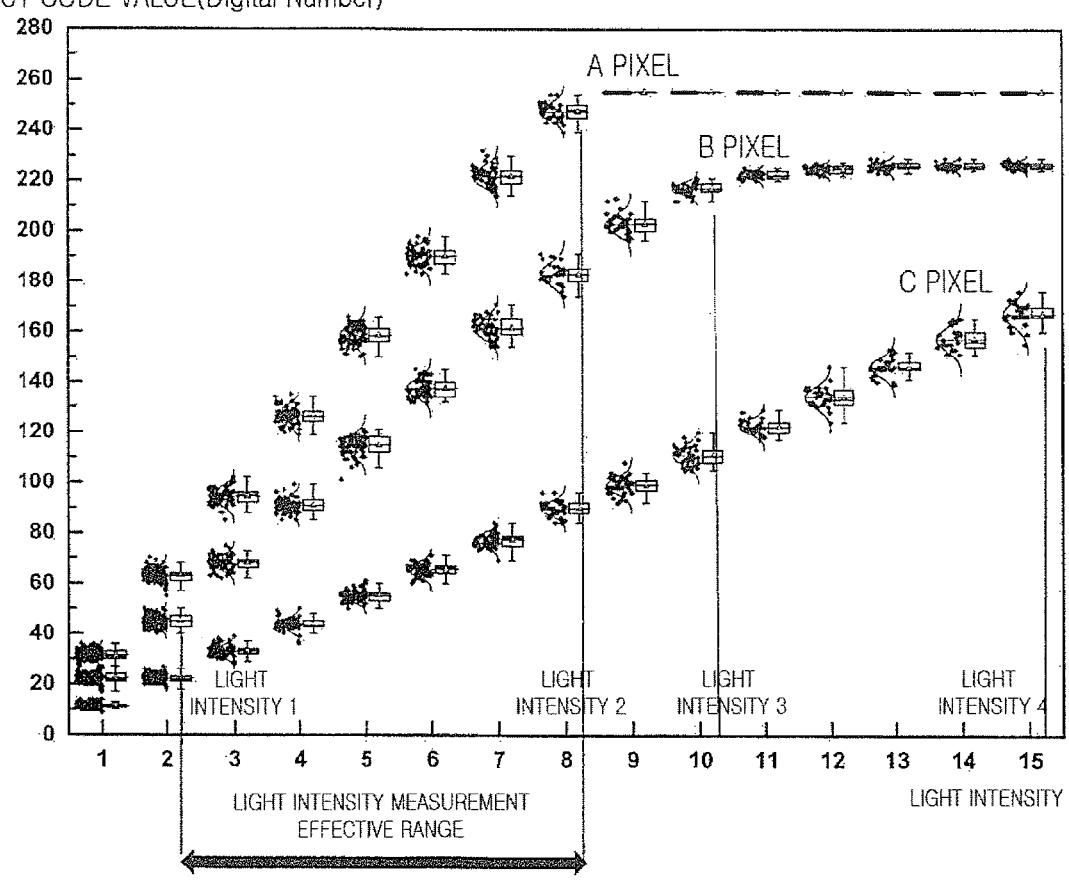

In one embodiment, a light intensity measurement effective range may be preset with respect to at least one pixel or all pixels of the sensor array. FIG. 6 illustrates an example of setting the light intensity measurement effective range. The light intensity measurement effective range may be set within a range in which output values linearly increase with respect to target pixels. For example, an interval in which a linear change of the output values does not appear for any one of the target pixels may be excluded from the light intensity measurement effective range.

At least one or all of the pixels of the sensor array may be selected by a user as the target pixels. In FIG. 6, when the target pixels are A, B, and C pixels, the light intensity measurement effective range may be specified as a range from "light intensity 1" to "light intensity 2."

In the present embodiment, the representative value is a value extracted according to statistical characteristics of the measurement value, and may be determined in consideration of the above-described noise value.

Specifically, the representative value is determined in consideration of an intermediate value (a median value), an average value, a mode value of the plurality of values which are collected N times, or a root mean square (RMS) value of noise by fixing the intensity and the wavelength of the light emitted from the light source. Here, N is an integer of 1 or more.

Referring to FIGS. 7A to 9, in the present embodiment, the representative value may be determined using a box plot.

FIGS. 7A to 9 are views for describing statistical characteristics according to the present embodiment. First, referring to FIG. 7A, in the present embodiment, box plot displays a value obtained by adding an average value to a noise RMS value in addition to a maximum value, a minimum value, an average value, an intermediate value (a median value), and a mode value as statistical characteristics of a measurement value which is measured for the same light intensity, and may allow a user to select the representative value. Generally, since the average value and the intermediate value (the median value) are values including noise, separating and displaying these values makes it possible for the user to instantaneously know which noise value is included in the measurement value.

When the noise RMS value is separately displayed, the noise RMS value deviates from the box plot. Therefore, since it is difficult for the user to intuitively select the representative value, the user may determine a distribution, a degree of noise, and the like using the maximum value and the minimum value by adding the noise RMS value to the average value, which is the most general expression, and thus the representative value may be easily determined.

In the present embodiment, when subtracting the noise RMS value from the average value instead of adding it thereto, the value obtained by adding the noise RMS value to the average value is displayed because a signal may be buried in the noise at a low signal region. However, when a minimum value of the signal is a certain level or more, the noise RMS may be displayed together through the subtraction.

In the present embodiment, the measurement may be performed by measuring intensity or a wavelength of light for pixels present in the same row in the optical sensor array.

In one embodiment, an output code value of a pixel is not wholly used as a reaction value of each pixel, a maximum-to-minimum range of a box plot illustrating a statistical distribution according to the plurality of times (N times) of measurement is expressed as the representative value, and thus an error range according to an overlapping interval may be reduced. The representative value may be an output code value within the corresponding range. Alternatively, the representative value may be an output code value that deviates from the corresponding range according to the setting.

Figure 7A:
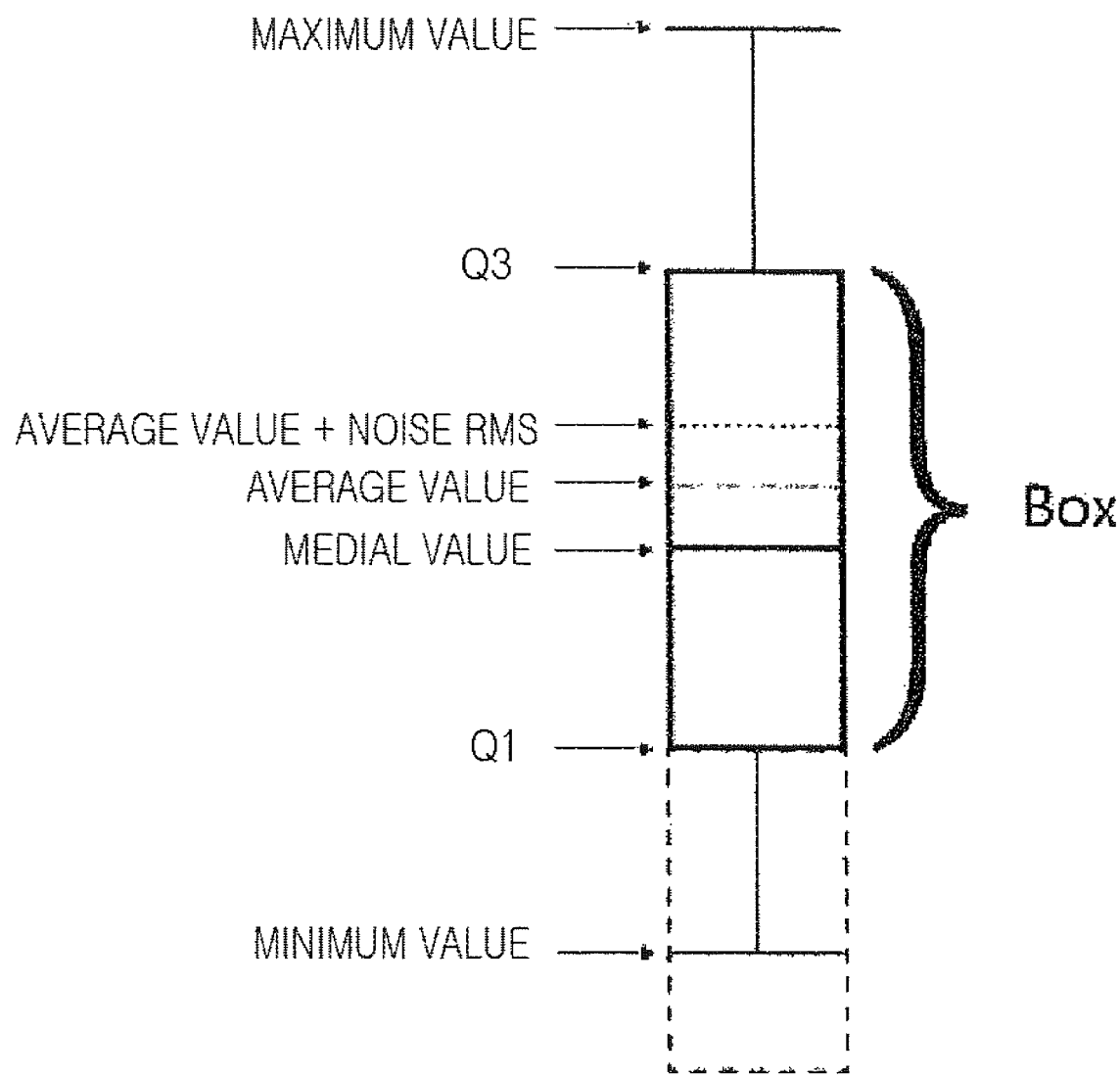
Figures 7B, 7C:
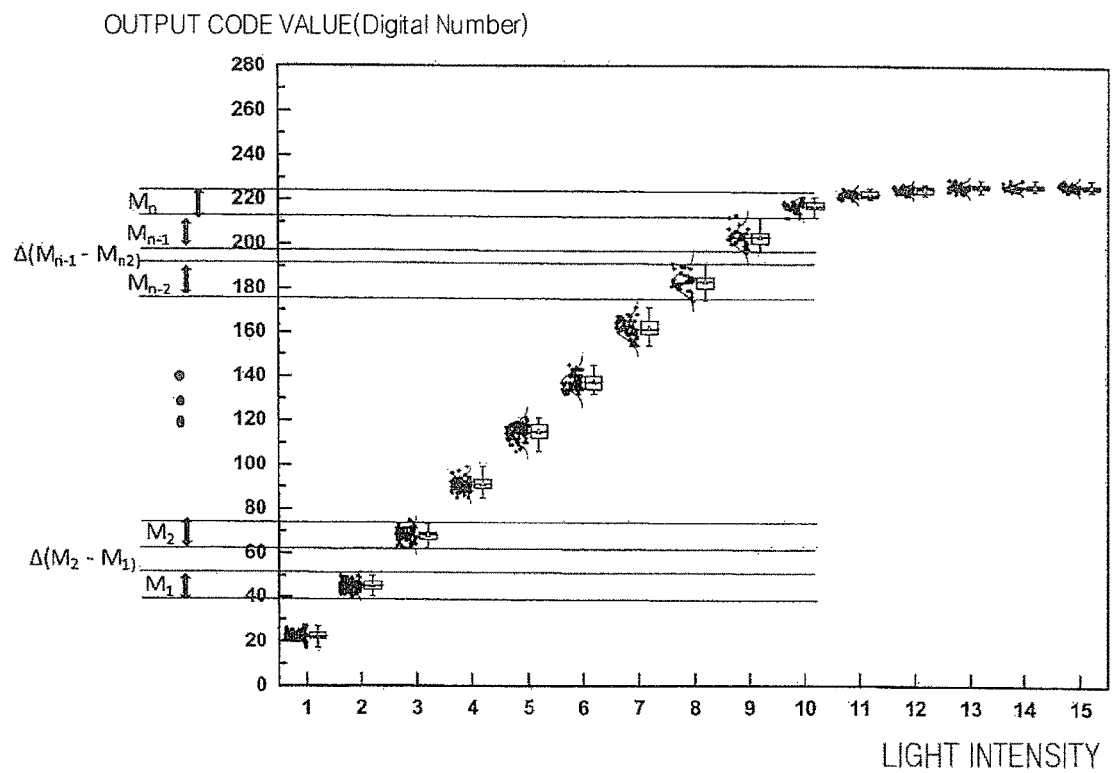

For example, as illustrated in FIG. 7B, one of output code values 39 to 51 may be represented by a representative value M1. The representative value M1 may be an output code value in a range of 39 to 51. Alternatively, the representative value M1 may be an output code value that deviates from the range of 39 to 51 according to the setting. One of output code values 61 to 73 may be represented by a representative value M2. In another example, the output code value of the pixel and the representative value may have a corresponding relationship, as illustrated in FIG. 7C.

Figure 8:
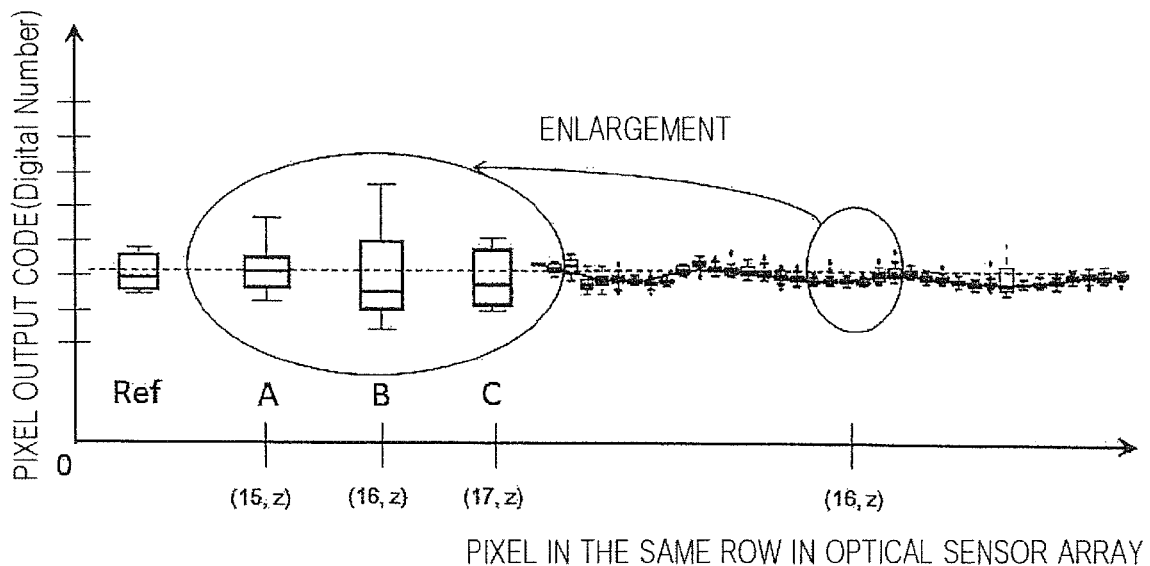

Referring to FIG. 8, it is possible to determine which of the reference values of correction is a representative value of a statistical distribution for planarization correction through the box plot and deduced values. For example, a reference for planarizing measurement values having a difference with respect to the distribution of the measurement values according to FIG. 8 is calculated, and a value which satisfies the reference may be set as a reference value for correcting.

Referring to FIG. 8, since an intermediate value (a median value) of a pixel A corresponds to a reference value which is indicated by a dotted line, the intermediate value (the median value) of the pixel A may be set to be the reference for correcting as the representative value.

In one embodiment, it may be determined that a reference pixel for planarization correction is a pixel having the highest density of the measurement values which are measured N times among all of the pixels. For example, referring to FIG. 7A, it may be determined that a pixel having the smallest interval between "value Q3" and "value Q1" among X pixels selected in order of the smallest interval between "maximum value" and "minimum value" among all of the pixels is a reference pixel for planarization correction. Here, X may be a number corresponding to 1% of the total number of pixels. Therefore, any one of an average value, an intermediate value (a median value), and a mode value of the selected reference pixel for planarization correction may be set as a reference value for planarization correction.

When the reference value for planarization correction is set, an output value of each of the other pixels may be corrected on the basis of the reference value for planarization correction. For example, a variable or a function for correcting the output value of each of the pixels of the sensor array through the reference value for planarization correction may be generated for each of the pixels.

In the present embodiment, the measurement may be performed by changing the intensity and the wavelength of the light.

Figure 9:
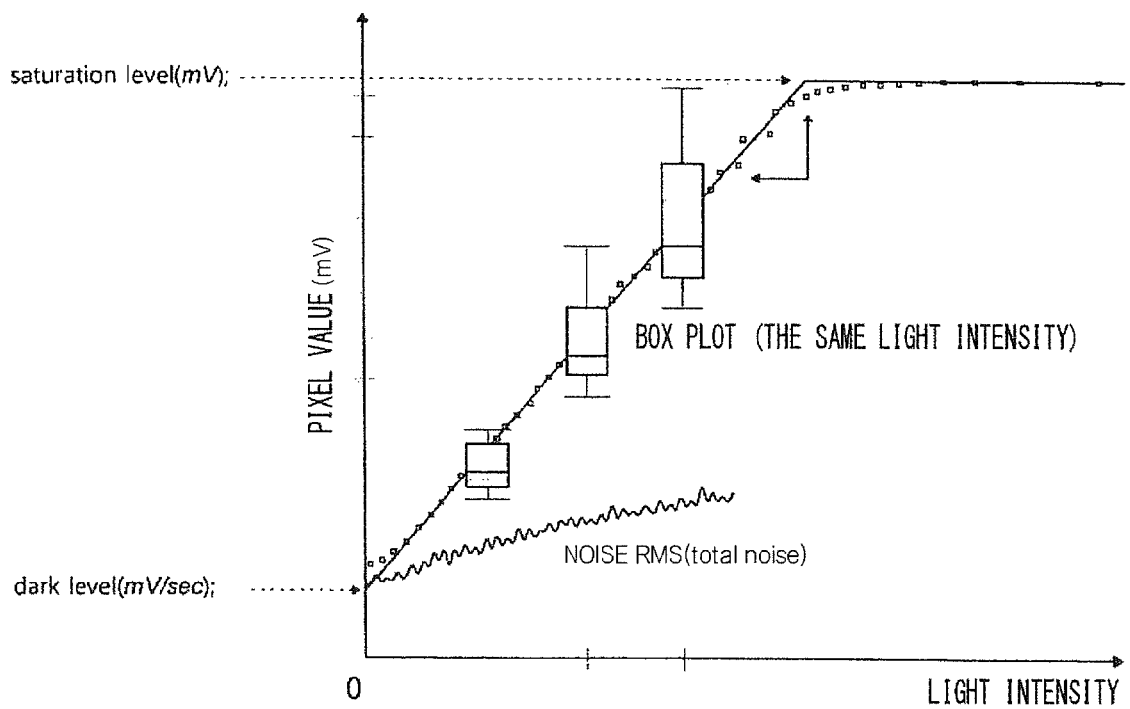

FIG. 9 is a graph illustrating output values of the pixels of the optical sensor array which are measured according to light intensity. Referring to FIG. 9, through the above graphs and the box plot, a saturation level, a dark level, noise, linearity, reactivity, a measurement error distribution, and the like of the measurement value may be deduced.

Referring to FIG. 9, it is possible to determine which of the reference value of correction is a representative value of statistical distribution for linearization correction through the box plot and deduced values. For example, a reference line which satisfies linearity with respect to a distribution of the measurement values according to FIG. 9 may be calculated, and a value which satisfies the reference line may be set as the reference value for correction. For example, an average value, an intermediate value (a median value), a mode value, or a maximum/minimum distribution may be compared with the reference line, and values having a large difference therewith may be excluded. When an intermediate value (a median value) which satisfies linearity is determined to be set as the representative value, the correction value is determined such that the other measurement values are converted into the intermediate value (the median value) as a reference.

In the first correction value calculating step according to the present embodiment, when the representative value is determined, a correction value for planarizing or linearizing the measurement value targeting the determined representative value is calculated.

For example, the values calculated in the above-described first correction value calculating step and the second to fourth correction value calculating steps, which will be described below, may be values for correcting the measurement values for the standard light source of the optical sensor array to satisfy the representative value. Each pixel may have the correction value according to the condition of the wavelength or intensity of the light source, and the correction value may be stored and managed in the form of a lookup table, as illustrated in Table 1.

TABLE 1

| Correction Target Value (n: Light Intensity) | (1: aaa) | (2: bbb) | ~ | (n − 1: yyy) | (n: zzz) |
|---|---|---|---|---|---|
| Output Value | $OES_{measure\_1}$ (,) | $OES_{measure\_2}$ (,) | | $OES_{measure\_n-1}$ (,) | $OES_{measure\_max}$ (,) |
| Sensor Planarization Correction Value | $PCC_1$ (,) | $PCC_2$ (,) | | $PCC_{n-1}$ (,) | $PCC_{Max}$ (,) |
| Sensor Linearization Correction Value | $LCC_1$ (,) | $LCC_2$ (,) | | $LCC_{n-1}$ (,) | $LCC_{Max}$ (,) |
| Applied Light Source Characteristic Correction Value | $LSCC_1$ (,) | $LSCC_2$ (,) | | $LSCC_{n-1}$ (,) | $LSCC_{Max}$ (,) |
| Spatial Non-uniform Correction Value due to Difference between Applied light Source and Sensor Pixel | $LUCC_1$ (,) | $LUCC_2$ (,) | | $LUCC_{n-1}$ (,) | $LUCC_{Max}$ (,) |
| Correction Value due to Intermediate Layer Medium Characteristic | $RMCC_1$ (,) | $RMCC_2$ (,) | | $RMCC_{n-1}$ (,) | $RMCC_{Max}$ (,) |
| Light Path and Transmittance Non-uniform Correction Value due to Difference between Applied Light Source and Sensor Pixel and Intermediate Layer | $LURMCC_1$ (,) | $LURMCC_2$ (,) | | $LURMCC_{n-1}$ (,) | $LURMCC_{Max}$ (,) |

TABLE 1-continued

| Correction Target Value (n: Light Intensity) | (1: aaa) | (2: bbb) | ~ | (n − 1: yyy) | (n: zzz) |
|---|---|---|---|---|---|
| Medium Characteristic Difference | | | | | |

(,) denotes a pixel at a position (i, j).
OES denotes an output electric signal value.
$OES_{measure\_zz}$ (,) denotes an output electric signal value measured in the pixel at the position (i, j).
PCC (,) denotes an optical sensor planarization correction value of a measurement value of the pixel at the position (i, j).
LCC (,) denotes an optical sensor linearization correction value of the measurement value of the pixel at the position (i, j).
LSCC (,) denotes an applied light source characteristic correction value of the measurement value of the pixel at the position (i, j).
LUCC (,) denotes a spatial non-uniform correction value due to a difference between an applied light source and a sensor pixel of the measurement value of the pixel at the position (i, j).
RMCC (,) denotes a correction value due to an intermediate layer medium characteristic of the measurement value of the pixel at the position (i, j).
LURMCC (,) denotes a light path and a transmittance non-uniform correction value due to the difference between the applied light source and the sensor pixel and the intermediate layer medium characteristic difference of the measurement value of the pixel at the position (i, j).

In the second correction value calculating step (S200) according to the present embodiment, a second correction value for the measurement value of the optical sensor array, which is corrected by the first correction value, is calculated with respect to light emitted from an applied light source or light emitted by a fluorescence reaction of the applied light source.

Specifically, the second correction value calculating step (S200) may be performed in a darkroom environment like the first correction value calculating step (S100). However, the second correction value calculating step (S200) is performed with respect to the applied light source in the application environment rather than the standard light source related to the light source.

A temperature, a wavelength, an incident angle, and the like are determined as environmental variables of the measurement for the second correction value calculating step (S200), and the measurement values of the optical sensor array according to the variables are collected.

Specifically, like the above-described first correction value calculating step (S100), the measurement may be performed by fixing intensity and a wavelength of the light emitted from the applied light source and determining the values using a difference between a plurality of values which are collected N times or a difference between the reference offset value and the collected value.

The measurement is performed N times according to the determined frame rate, as illustrated in FIG. 5A, and a difference between measurement values in consecutive frames among a series of the values measured N times is calculated, as illustrated in FIG. 5B. A representative value may be set through the box plot illustrated in FIG. 7A through the statistics of the measured values and the difference between the measured values.

Next, as described in FIG. 3, the optical sensor array according to the present embodiment may further include an intermediate layer for reaction thereon.

The intermediate layer may actually be stacked according to a packaging of the optical sensor array, and may be formed of a plurality of layers.

Therefore, the correction method according to the present embodiment performs an additional correction value calculating step.

In the present embodiment, in the third correction value calculating step (S300), statistical characteristics of a measurement value of an optical sensor array in which a predetermined intermediate layer is stacked are analyzed with respect to the light emitted from the standard light source to extract a representative value, and a third correction value for the measurement value according to the extracted representative value is calculated.

For example, in the third correction value calculating step (S300), the correction value is calculated for the case in which the optical sensor array includes the intermediate layers with respect to the darkroom environment and the standard light source.

However, in the third correction value calculating step (S300), when extracting the representative value according to the statistical characteristics, the box plot according to FIGS. 7A to 9 is applied, it is necessary to distinguish a relative noise level with the intermediate layer, and thus it is necessary to extract a representative value according to an actual influence of the intermediate layer.

For example, rather than setting the representative value simply in consideration of only a size of the box plot with respect to the measurement value of the optical sensor array, it is necessary to set a measurement value of a pixel in which an error of the measurement value due to the noise generated along the intermediate layer is minimized as the representative value.

In this case, when an uncertainty range of the optical sensor array itself is greater than an uncertainty range of the intermediate layer, it is impossible to determine noise in the intermediate layer. Therefore, a representative value of and a correction value for the intermediate layer within a range in which it is possible to determine noise may be calculated by determining the uncertainty ranges.

Next, in the fourth correction value calculating step (S400), a fourth correction value for the measurement value of the optical sensor array in which the intermediate layers are stacked, that is corrected by the third correction value, with respect to the light emitted from the applied light source or the light emitted by the fluorescence reaction to the applied light source is calculated.

In the fourth correction value calculating step (S400), the correction value is calculated for the case in which the optical sensor array includes the intermediate layers with respect to the darkroom environment and the applied light source.

Specifically, the method of calculating the correction value corresponds to the above-described second correction value calculating step (S200). In this case, the optical sensor array may perform the measurement by applying the third correction value instead of the first correction value.

The correction values calculated in the first to fourth correction value calculating steps may be stored and managed in the form of the lookup table, as illustrated above in Table 1.

For example, in the present embodiment, Table 1 is a table illustrating values for correcting the measurement values of the optical sensor array according to the standard light source in relation to the first or third correction value calculating step, and an additional column including the correction value according to the applied light source for the second correction value may be added thereto.

Furthermore, in addition to the applied light source, a column in which the fourth correction value is included as the correction value related to the intermediate layer may be added thereto. In this case, the columns may be divided into various factors that affect a reaction as characteristics of the intermediate layer.

For example, for a large classification of the intermediate layer, types of various layers (e.g., hydrophilic/hydrophobic/antibody immobilization/bandpass filters, a glass membrane, and the like) constituting the intermediate layer, combination information of these layers, a molar concentration of chemicals constituting the intermediate layer, and the like may be included in detailed classification items.

Therefore, various factors that affect the measurement values of the optical sensor array and the correction values therefor may be included in the added columns.

Hereinafter, a measurement environment of the above-described first to fourth correction value calculating steps will be described in detail with reference to the drawings.

Figure 10:
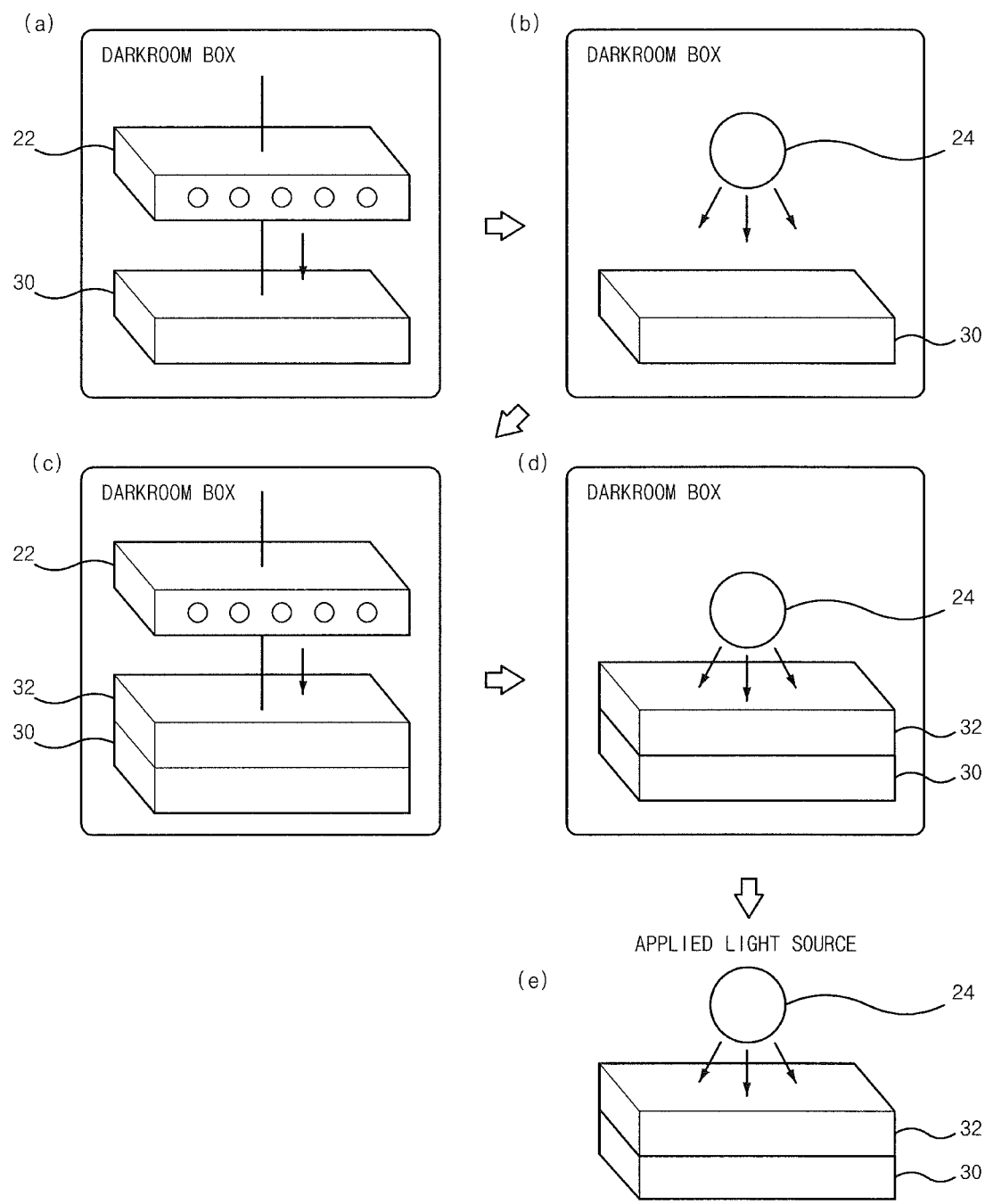
FIGS. 10 to 12 are views conceptually illustrating a measurement environment of each step of a method for correcting a packaged optical sensor array module according to an embodiment of the present invention.
Figure 11:
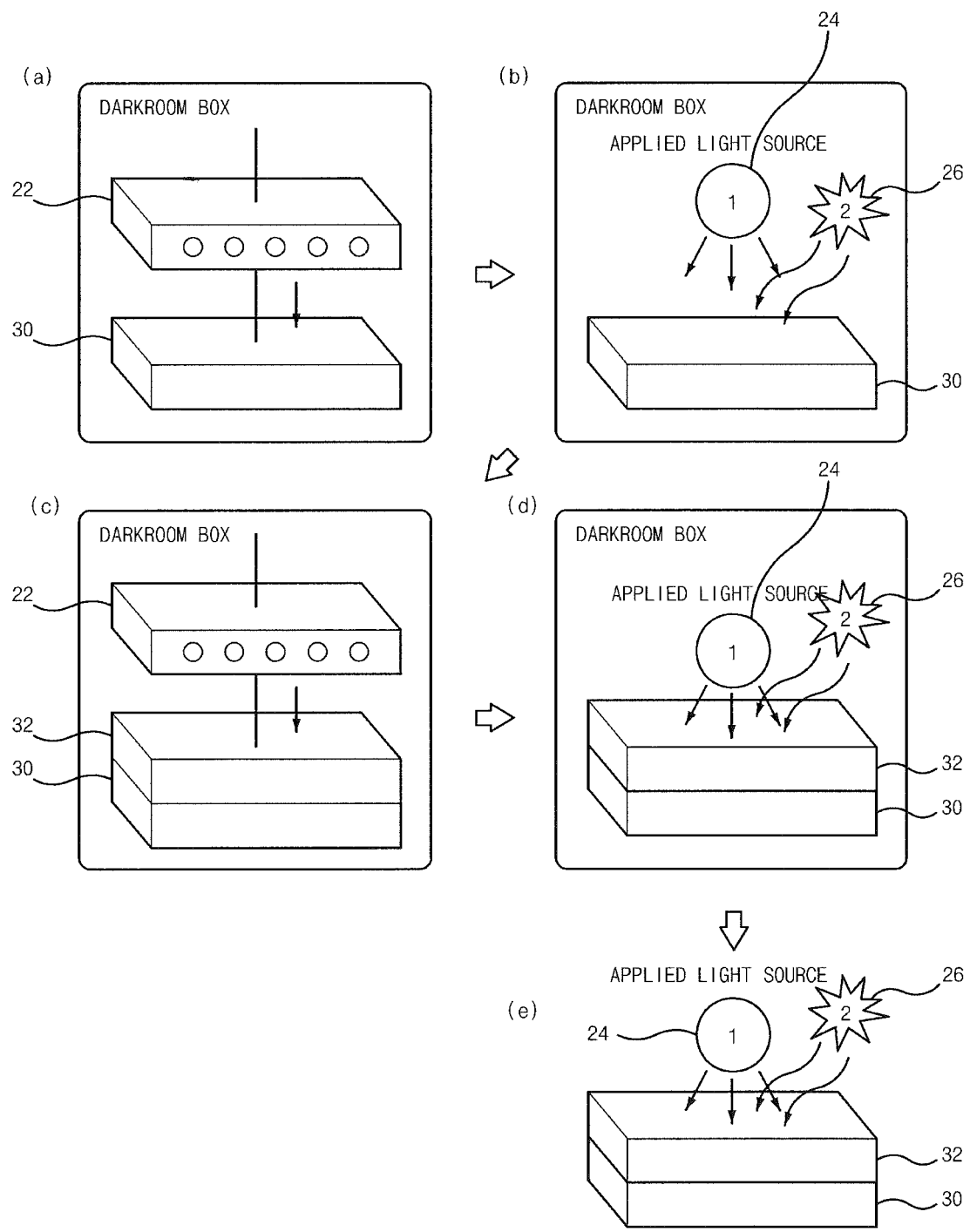

A measurement environment for calculating the first to fourth correction values according to the above descriptions is illustrated in FIGS. 10 and 11.

Referring to FIG. 10, the first correction value calculating step (S100) is performed for a standard light source 22 in a darkroom environment (a), and the second correction value calculating step (S200) is performed for an applied light source 24 in the darkroom environment (b).

The third correction value calculating step (S300) is performed for the standard light source 22 in the darkroom environment and the measurement is performed by stacking intermediate layers 32 on the optical sensor array (c), and the fourth correction value calculating step (S400) is performed for the applied light source 24 rather than the standard light source in the same environment as the third correction value (d).

Then, the first to fourth correction values are applied, and diagnosis may be performed by performing the measurement on the optical sensor array to which the applied light source 24 and the intermediate layers 32 are applied in a package in the actual application environment (e).

In the above example, although the measurement for the applied light source which directly emits light is exemplarily described, the correction value may be calculated in consideration of the fluorescence reaction for the light emitted from the applied light source.

Referring to FIG. 11, the first correction value calculating step (S100) is performed for the standard light source 22 in the darkroom environment (a), and the second correction value calculating step (S200) is performed for the applied light source 24 and a fluorescence reaction 26 in the darkroom environment (b).

The third correction value calculating step (S300) is performed for the standard light source 22 in the darkroom environment, and the measurement is performed by stacking the intermediate layers 32 on the optical sensor array (c), and the fourth correction value calculating step (S400) is per-formed for the applied light source 24 rather than the standard light source 22 in the same environment as the third correction value, and the measurement is performed for the applied light source 24 and the fluorescence reaction 26.

Then, the first to fourth correction values are applied, and diagnosis may be performed by performing the measurement on the optical sensor array to which the applied light source 24 and the intermediate layers 32 for the fluorescence reaction 26 are applied in the package in the actual application environment (e). For example, a measurement value according to an actual reaction may be calculated by selecting and applying the first to fourth correction values according to the present embodiment to an optical sensor array in which the applied light source 24 and the intermediate layers 32 are formed.

Specifically, in the present embodiment, measurement values before a reaction of the optical sensor array in an application environment to which at least one correction value of the first to fourth correction values is applied are corrected, and an average value thereof is calculated. The measurement values for each pixel (x, y) of the optical sensor array may be expressed by Equation 1.

$$\begin{pmatrix} DN_{avg\_bef}(x_1, y_1) & \cdots & DN_{avg\_bef}(x_i, y_1) \\ \vdots & \ddots & \vdots \\ DN_{avg\_bef}(x_1, y_j) & \cdots & DN_{avg\_bef\nu}(x_i, y_j) \end{pmatrix} = \quad \text{[Equation 1]}$$

$$\sum_{n=1}^{N} \begin{pmatrix} DN_{bef\_n}(x_1, y_1) & \cdots & DN_{bef\_n}(x_i, y_1) \\ \vdots & \ddots & \vdots \\ DN_{bef\_n}(x_1, y_j) & \cdots & DN_{bef\_n}(x_i, y_j) \end{pmatrix} \Big/ N$$

Next, the measurement values of each of the pixels (x, y) of the optical sensor array during the reaction may be expressed by Equation 2.

$$\begin{pmatrix} DN_{avg\_dur}(x_1, y_1) & \cdots & DN_{avg\_dur}(x_i, y_1) \\ \vdots & \ddots & \vdots \\ DN_{avg\_dur}(x_1, y_j) & \cdots & DN_{avg\_dur}(x_i, y_j) \end{pmatrix} = \quad \text{[Equation 2]}$$

$$\sum_{n=1}^{N} \begin{pmatrix} DN_{dur\_n}(x_1, y_1) & \cdots & DN_{dur\_n}(x_i, y_1) \\ \vdots & \ddots & \vdots \\ DN_{dur\_n}(x_1, y_j) & \cdots & DN_{dur\_n}(x_i, y_j) \end{pmatrix} \Big/ N$$

In this case, a final output value is calculated using a difference between an average value of the measurement values before the reaction and an average value of the measurement values during the reaction, and diagnosis may be performed through the optical sensor array.

The final output value may be expressed by Equation 3.

$$\begin{pmatrix} D(x_1, y_1) & \cdots & D(x_i, y_1) \\ \vdots & \ddots & \vdots \\ D(x_1, y_j) & \cdots & D(x_i, y_j) \end{pmatrix} = \quad \text{[Equation 3]}$$

$$\begin{pmatrix} DN_{avg\_bef}(x_1, y_1) & \cdots & DN_{avg\_bef}(x_i, y_1) \\ \vdots & \ddots & \vdots \\ DN_{avg\_bef}(x_1, y_j) & \cdots & DN_{avg\_bef}(x_i, y_j) \end{pmatrix} -$$

$$\begin{pmatrix} DN_{avg\_dur}(x_1, y_1) & \cdots & DN_{avg\_dur}(x_i, y_1) \\ \vdots & \ddots & \vdots \\ DN_{avg\_dur}(x_1, y_j) & \cdots & DN_{avg\_dur}(x_i, y_j) \end{pmatrix}$$

In addition, in the above-described embodiment, although the measurement value of the optical sensor array, for example, the measurement value of a pixel having the smallest error range and the smallest value of a box plot obtained by comparing measurement values in the same row or column, is set to be a representative value, an additional corrected single photodiode may be set in the measurement environment such that the values are compared to select a representative value.

Figure 12:
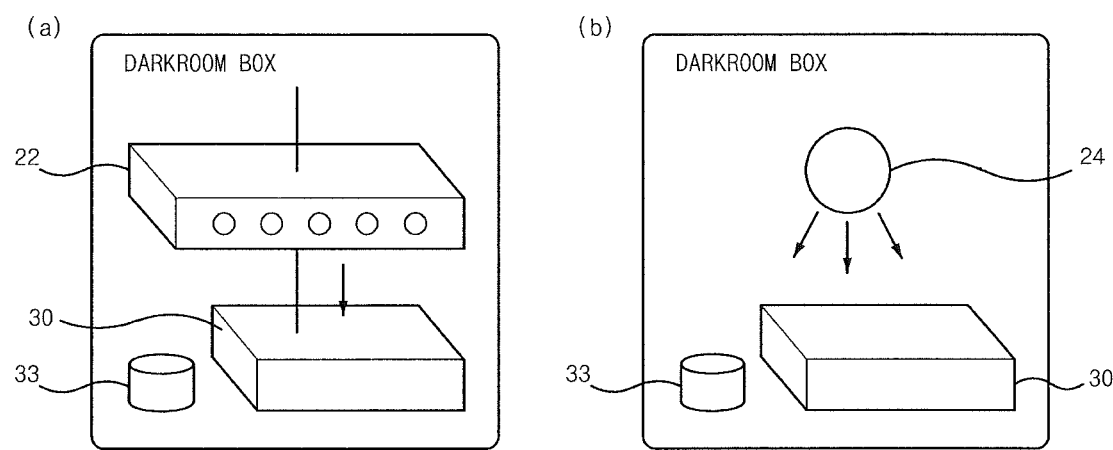

Referring to FIG. 12, according to another embodiment, the measurement is performed by providing a separate corrected photodiode 33 on a side surface of the optical sensor array in the environment illustrated in FIG. 10.

Accordingly, in the first correction value calculating step (S100), when the representative value is determined, a step of calculating a representative pixel and a representative value may be further performed by comparing statistical characteristics of sensitivity measurement value of the corrected single photodiode 33 with respect to the light emitted from the standard light source 22 having the predetermined characteristic value with statistical characteristics of sensitivity measurement values of all of the pixels of the optical sensor array.

For example, when using the statistical characteristics, the corrected measurement value of the pixel of the optical sensor array, which is formed with the smallest range of the box plot, or the corrected measurement value of the single photodiode 33 may be set as the representative value by comparing the statistical characteristics of the measurement values of the optical sensor array with the statistical characteristics of the sensitivity measurement values of the photodiode 33.

Figure 13:
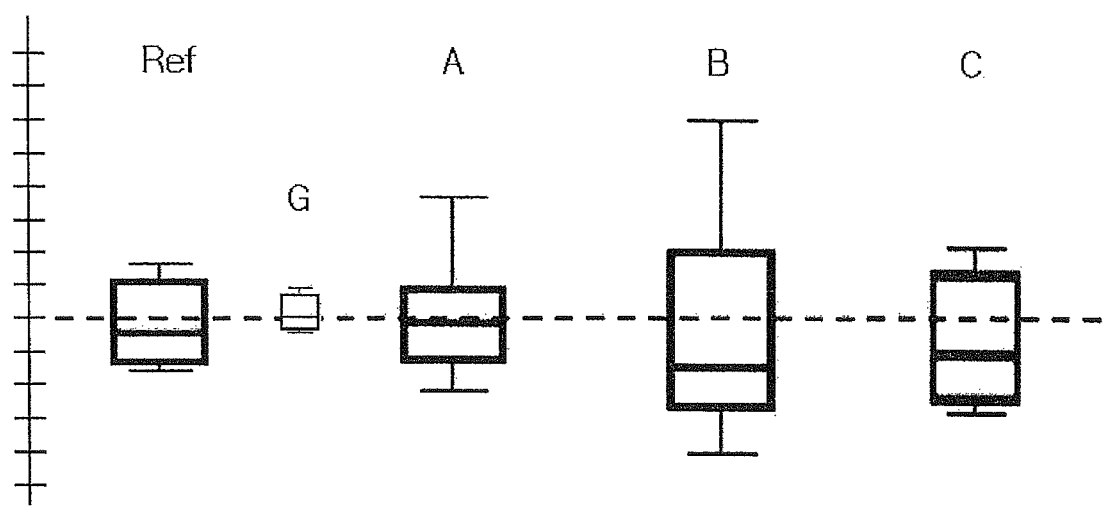
FIG. 13 is a view for describing some processes of a method for correcting a packaged optical sensor array module according to an embodiment of the present invention.

Referring to FIG. 13, a box plot ref of the corrected photodiode 33 and box plots A, B, C, and G of each pixel of the optical sensor array may be compared to set a reference pixel with a value that shows the smallest range. One of an average value, an intermediate value (a median value), and a mode value of the reference pixel may be set as a representative value. When the box plot of the corrected photodiode 33 has a statistical distribution greater than a box plot of any pixel of the optical sensor array, the measurement may be performed again by replacing the corrected photodiode 33 with a corrected photodiode having better performance.

When one pixel of the optical sensor array other than the corrected photodiode 33 is set as the reference pixel, reliability of the representative value may be improved by increasing the number of measurements for the set reference pixel.

The measurement value of the photodiode 33 may be applied to all of the second to fourth correction value calculating steps other than the first correction value calculating step. In this case, accuracy may be relatively higher than when using only the optical sensor array.

In the second correction value calculating step (S200), the second correction value may be calculated by determining an effect of time or temperature change and spatial non-uniformity together.

For example, in the above-described embodiment, the second correction value for correcting a measurement error of the applied light source 24 of the optical sensor array in which the first correction value is applied and linearized or planarized is calculated, and a more accurate second correction value in consideration of the effect of time or temperature and the spatial non-uniformity may be additionally calculated.

Specifically, the second correction value calculating step (S200) may further include a step (S210) in which intensity of the applied light source 24 is continuously measured M times using a single representative pixel, and the statistical characteristics of the applied light source 24 are then analyzed with respect to a time or temperature change to calculate a 2-1 correction value for correcting optical output instability, and a step (S220) in which spatial instability according to a distance and an incident angle difference between the applied light source 24 and each sensor array is analyzed to calculate a 2-2 correction value by measuring the intensity of the light from the applied light source 24 using the entire optical sensor array corrected by the first correction value being applied thereto.

The above-described method for correcting a packaged optical sensor array module may be applied together with the method for correcting an optical sensor array through characteristic evaluation. Hereinafter, the method for correcting an optical sensor array through characteristic evaluation will be described. The method for correcting an optical sensor array through characteristic evaluation will be described below in detail with reference to the accompanying drawings.

Figure 14:
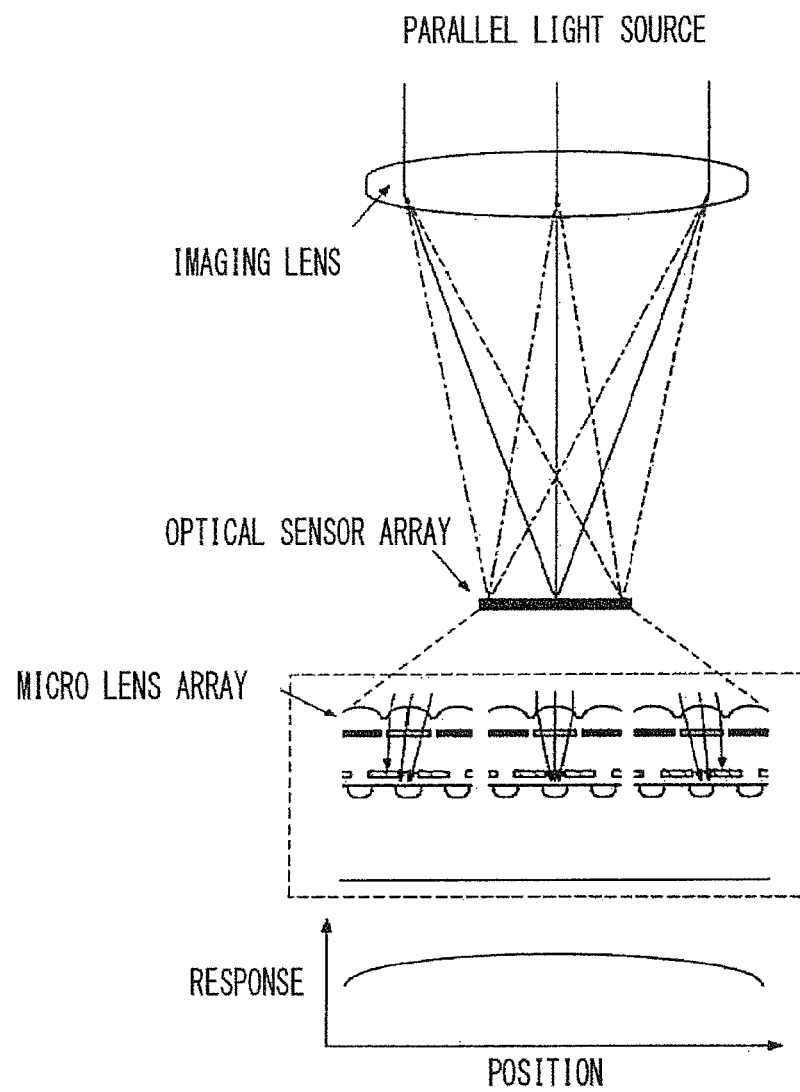
FIG. 14 is a view illustrating a structure of a digital camera with respect to a general light source.
Figure 15:
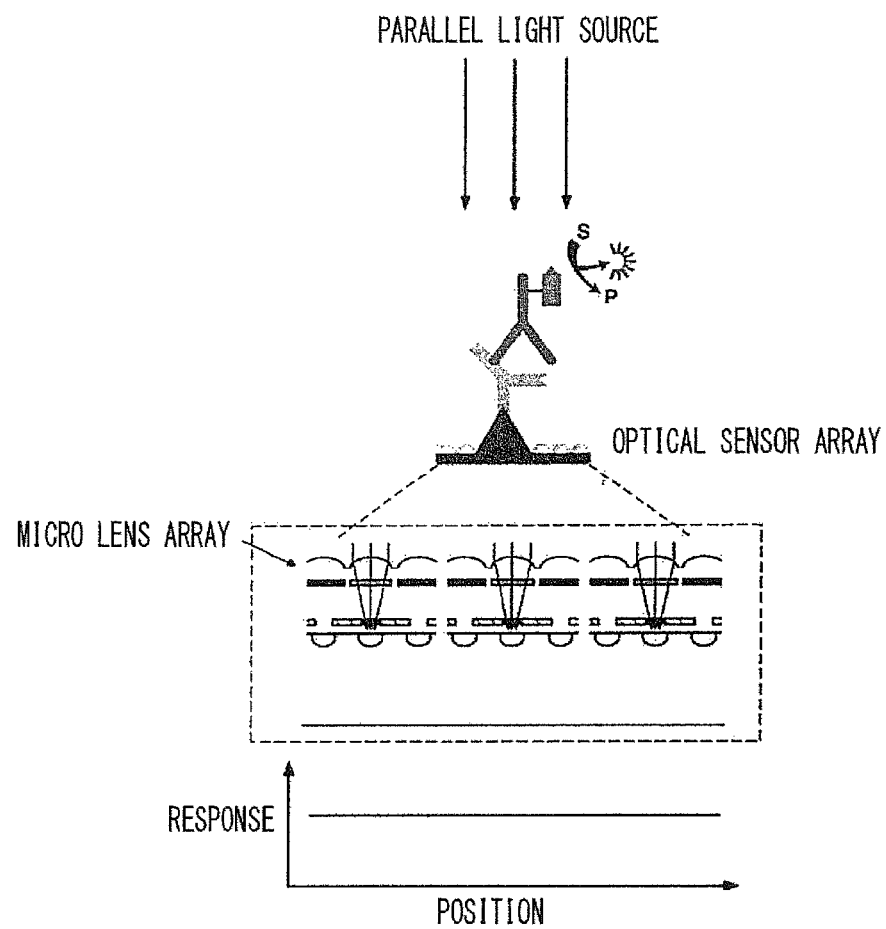
FIG. 15 is a view illustrating a structure of an optical sensor array according to an embodiment of the present invention.

FIG. 14 is a view illustrating an example application of a conventionally used general optical sensor, and FIG. 15 is a view illustrating an optical sensor used according to an embodiment of the present invention.

Referring to FIGS. 14 and 15, the optical sensor according to an embodiment does not include a separate external lens.

Specifically, as illustrated in FIG. 14, since the optical sensor additionally includes an imaging lens, the optical sensor includes a mount structure and a barrel structure for mounting the lens, which causes a problem in that an overall thickness of the sensor is thickened.

On the other hand, as illustrated in FIG. 15, since the optical sensor according to an embodiment includes only of a light source which emits light and an optical sensor for measuring light output from a test sample, a configuration thereof may be relatively simplified.

However, the optical sensor according to an embodiment needs to have different characteristic measurement conditions from a general camera sensor having an external lens. In the general camera, an image is determined by interpolating neighboring pixel values passed through a red filter, a green filter, and a blue filter assigned to each pixel. However, in the present embodiment, each pixel value itself refers to a measurement value of the corresponding pixel. Reliability of accuracy is more important because each of the pixels is a measuring instrument.

Since a final signal value is affected by a printed circuit board (PCB) which reads a signal value from the sensor as well as by the light source and the sensor, the entire array may be fully tested and corrected under various conditions in an actual flip chip sensor mounted on the PCB, as in the present embodiment instead of conventional wafer testing.

Specifically, in a system in which a camera lens is mounted on a conventional semiconductor sensor, a focus of a lens thereof may be adjusted. However, in the optical sensor according to an embodiment, since the measurement is performed at a level of almost contact with a test sample without a lens, a setting method and a correcting method for a test environment are required.

For example, in order to obtain a standardized response result, as illustrated in FIG. 15, it is necessary to set correction parameters such as a surface structure of the optical sensor array or a light path difference caused by structures such as an inner micro lens, a color filter, and the like.

Figure 16:
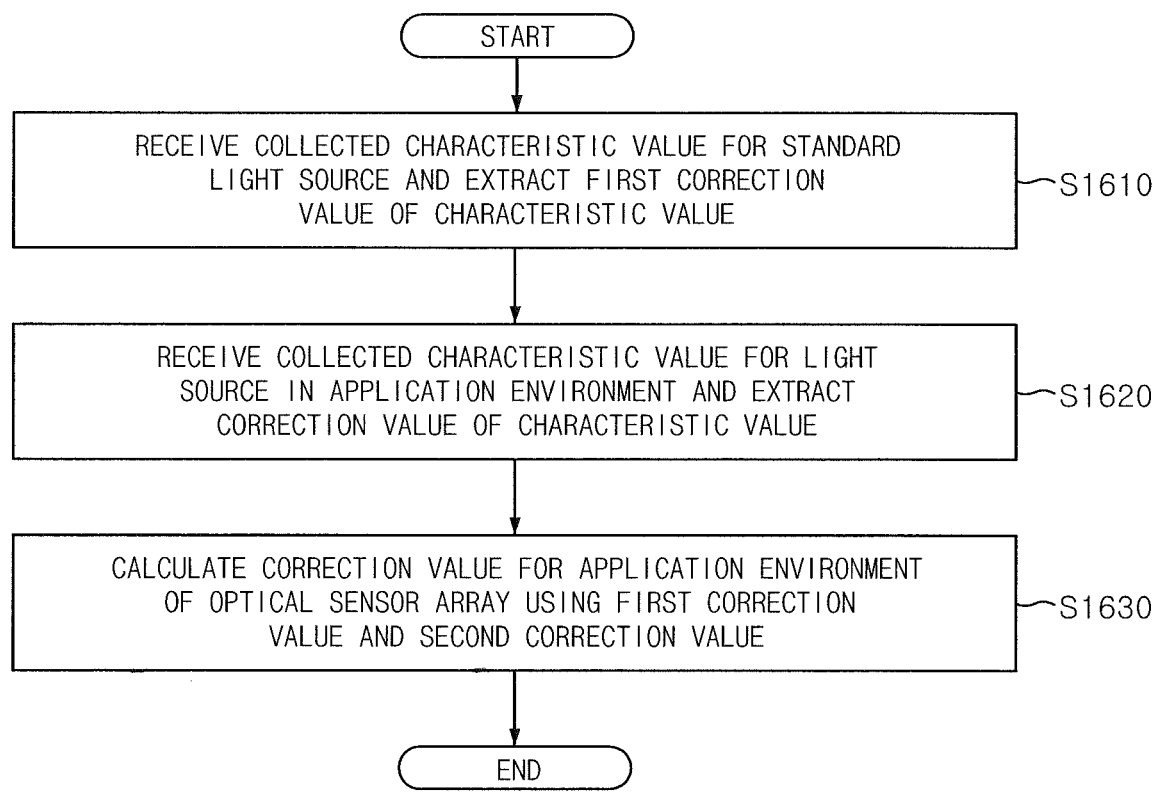
FIG. 16 is a flowchart illustrating a method of correction through a characteristic evaluation of an external lens-free optical sensor array according to an embodiment of the present invention.

Hereinafter, a correction method for securing reliability of characteristics of light emitted from a sample through a lens-free optical sensor according to an embodiment, and specifically, a method of setting measurement parameters including intensity, a wavelength, and an optical axis of light to be used, will be described with reference to FIG. 16.

A method for correcting an optical sensor array according to an embodiment through characteristic evaluation (hereinafter, referred to as a correction method) includes a first test step (S1610), a second test step (S1620), and a correcting step (S1630).

In one embodiment, in the first test step (S1610), collected characteristic value of an optical sensor array relative to a standard light source having a predetermined characteristic value is received, and a first correction value of the collected characteristic value is extracted.

For example, in order to perform total evaluation of the optical sensor array through the standard light source, characteristic values such as a degree of planarization, linearity, sensitivity of a sensor, and a signal to noise ratio (SNR) may be measured.

The first test may require a configuration of a darkroom and uniformity of the light source.

Figure 19:
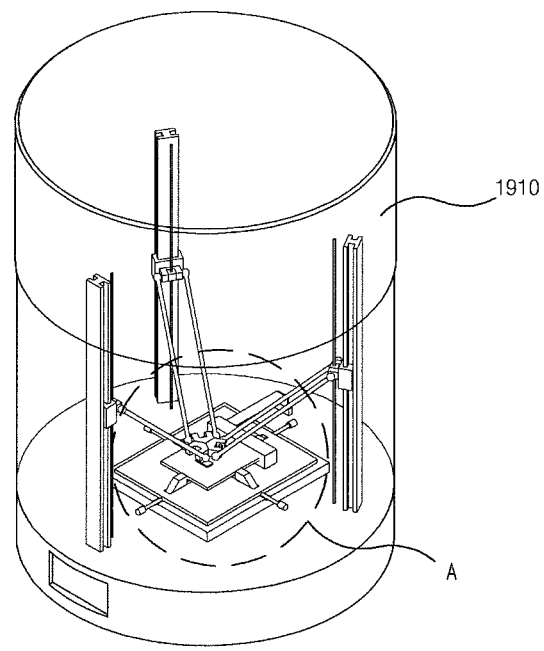
FIGS. 19 and 20 are views illustrating an environment in a first test step according to an embodiment of the present invention.
Figure 20:
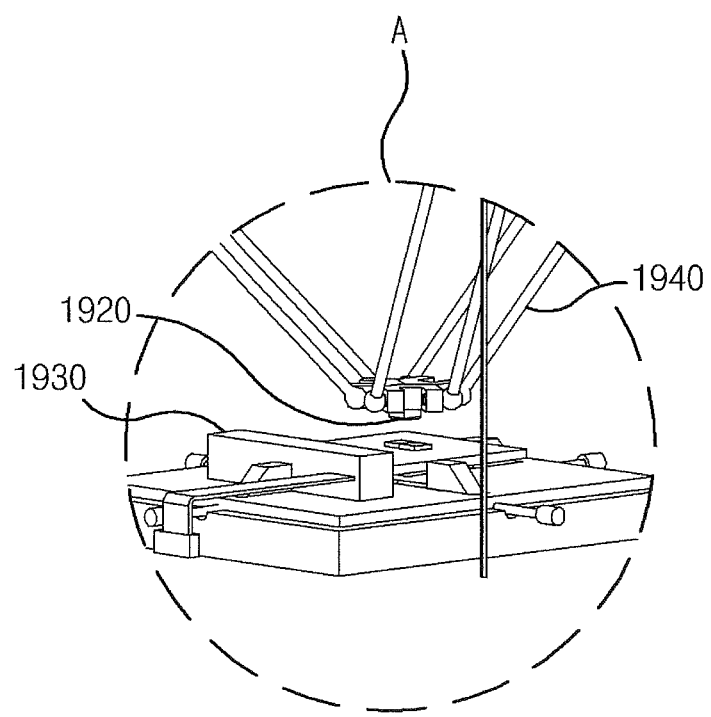

An environment of the first test will be described with reference to FIGS. 19 and 20. FIGS. 19 and 20 are views illustrating the environment of the first test according to an embodiment of the present invention.

For example, in FIG. 19, entry of external noise is blocked through a dark room configuration 1910 of the first test. Therefore, a device for testing may be sealed with a housing.

The test device will be described with reference to FIG. 20.

FIG. 20 is an enlarged view of region A in FIG. 19.

Referring to FIG. 20, in one embodiment, light of a light source 1920 passes through a monochromator toward a tungsten lamp light source, and light of a desired wavelength is obtained and then connected to an integrating sphere. An optical sensor array 1930 is arranged to be perpendicularly to an output port of the integrating sphere. Spatial uniformity of a light source of the output port of the integrating sphere should be within 0.1% of a total area of the optical sensor array and within 0.5% of the uniformity over time. Uniformity within 1% of a light amount corresponding to one code of the pixel output value may be maintained. In one embodiment, an environment of a light source which satisfies performance approved by an accredited certification authority is referred to as the standard light source 1920.

Since the sensor according to an embodiment does not include an external lens, a distance between the light source and the sensor may act as a parameter which affects characteristic evaluation. In this case, the distance may be calculated in consideration of geometrical characteristics of a micro lens of the sensor array itself. In addition, a jig configuration 1940 for aligning an optical axis or a distance may be included therein.

When an initial setting for the first test according to the above description is completed, output code values of all pixels are read as characteristic values while the wavelength of the light source is set and intensity of the light source is increased at uniform intervals.

A description thereof will be given in more detail with reference to FIG. 18.

Figure 17:
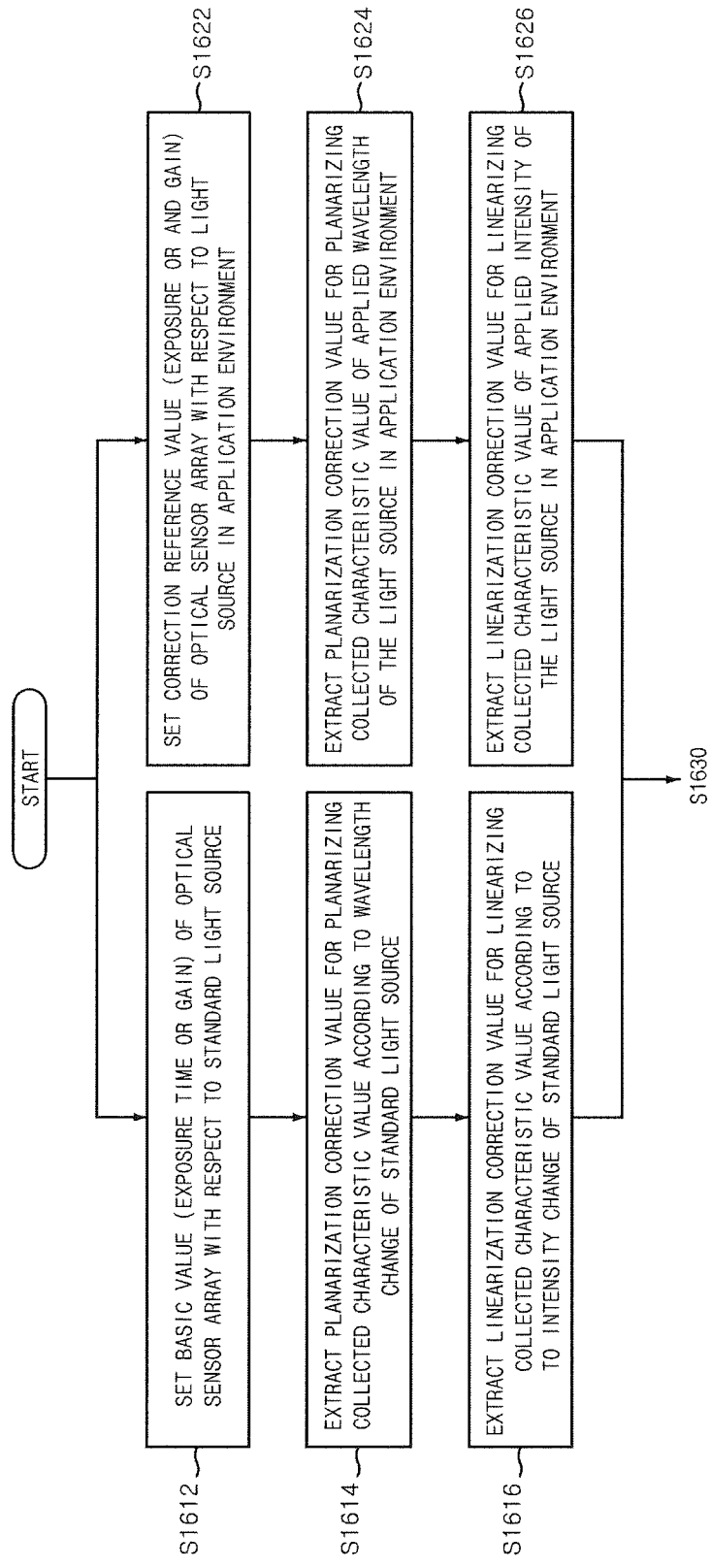
FIG. 17 is a detailed flowchart illustrating a test step of FIG. 16 in more detail.

Referring to FIG. 17, in the first test step (S1610) according to an embodiment, a planarization correction value for planarizing the collected characteristic value of the optical sensor array according to the wavelength change of the standard light source is extracted (S1614), and a linearization correction value for linearizing the collected characteristic value of the optical sensor array according to the intensity change of the standard light source is extracted (S1616).

First, in order to extract the planarization correction value, a matrix value for planarization correction of the optical sensor is obtained while the wavelength of the light source is changed, and the matrix value is stored in a database to form a correction coefficient lookup table.

Referring to FIG. 15 for planarization according to an embodiment, the optical sensor according to an embodiment has a micro lens for each pixel of the sensor array without the external lens, as illustrated in FIG. 14.

In this case, since geometrical curvatures of micro lenses are slightly different from each other, a difference between light paths is generated, and, in one embodiment, each pixel value itself refers to a measurement value at which the corresponding pixel responds, and it is necessary to standardize the pixel value as a reference in order to reduce an error of each of the pixel values due to the light path changed according to the curvature of the micro lens or the additional filter configuration.

Therefore, in one embodiment, in order to obtain a response result illustrated in FIG. 15, the pixel value measured through the planarization correction coefficient calculation is standardized in software.

Next, there are limitations on the control of the uniformity of the major characteristic parameters such as a doping concentration in a semiconductor fabrication process of sensors and there is a light absorption physical characteristic of silicon constituting the photodiode, and thus a sensitivity deviation between the pixels is generated and nonlinearity is obtained. Therefore, in order to extract the linearization correction value, a matrix value for linearization correction of the optical sensor is obtained while the intensity of the light source is changed and stored in a database to form the correction coefficient lookup table.

In one embodiment, the matrix value for planarization correction and the matrix value for linearization correction may be extracted through Equation 4.

$$COC_n(x_i,y_j)=MOC_{navg}(x_i,y_j)*PCC_n(x_i,y_j)*LCC_n(x_i,y_j) \quad \text{[Equation 4]}$$

Here, $(x_i,y_j)$ denotes a name of the pixel in an $i^{th}$ row and a $j^{th}$ column, and n denotes an output code value thereof. For example, in an 8-bit analog-to-digital converter (ADC), n is a value from 0 to 255.

$COC_n(x_i,y_j)$ is a corrected output code value of the pixel in the $i^{th}$ row and the $j^{th}$ column.

$MOC_{navg}(x_i,y_j)$ is a measured output code value of the pixel in the $i^{th}$ row and the $j^{th}$ column.

$PCC_n(x_i,y_j)$ is a planarization correction value of the pixel in the $i^{th}$ row and the $j^{th}$ column.

$LCC_n(x_i,y_j)$ is a linearization correction value of the pixel in the $i^{th}$ row and the $j^{th}$ column.

A dynamic range of the optical sensor array according to an embodiment and an SNR value may be included therein as characteristic values.

In addition, the first test step (S1610) according to an embodiment further includes a step (S1612) in which an exposure time or gain of the optical sensor array relative to the standard light source is set to be a default value, and a test for the set amount of light may be performed.

Then, in the second test step (S1620) according to an embodiment, the amount of light of the standard light source, which is set in the first test step (S1610), is the target amount of light, and the collected characteristic value for the light source in the application environment of the optical sensor array having the correction reference value determined according to the target amount of light is received.

For example, in order to calculate the correction value for the optical sensor array through a characteristic value of the application environment and a characteristic value of the standard light source, a reference may be set to allow the amount of light of a light source used in each test to correspond to each other.

In this case, since the optical sensor array may use the exposure time and the gain as setting parameters thereof, the target amount of light and the amount of light in the current environment in which the optical sensor array is applied are the same, or the exposure time or the gain is set as a reference for extracting the correction value so that the ratios thereof are equal to each other.

In one embodiment, the exposure time or the gain may be set to a value which satisfies Equation 5.

$$\frac{OC_{refOC}}{MOC} = \text{Luminence\_Ratio} \propto (IT_{new\_set}, Gain_{new\_set}) \quad \text{[Equation 5]}$$

In this case, Luminence_Ratio denotes a ratio of a target amount of light ($OC_{refOC}$) to an amount of light (MOC) in the application environment, the collected characteristic value according to the exposure time or the gain adjusted value for adjusting the amount of light of the light source in the application environment to the target amount of light, or a combination thereof, and the collected characteristic value is set to be the correction reference value (the exposure time and the gain) and applied (S1622).

Next, in one embodiment, in the second test step (S1620), the second correction value of the characteristic value of the light source in the application environment is extracted in the light source in the application environment by receiving the collected characteristic value of the set optical sensor array in which the correction reference value is set.

For example, in the second test step (S1620), the characteristic value of the optical sensor array with respect to the application environment is used, and the sensing characteristic value according to luminescence or fluorescence related to a bio reaction such as a biosensor is extracted.

The second test step (S1620), according to an embodiment, may also be performed through a darkroom configuration, as in the above-described first test step (S1610).

Specifically, in the second test step (S1620), the structure of the sensor used in the first test step (S1610) is implemented in an actual packaging environment, and, accordingly, the characteristic measurement is performed.

Figure 21:
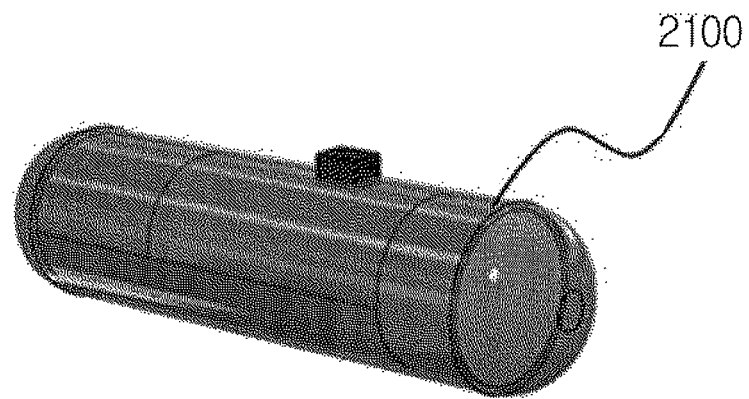
FIGS. 21 and 22 are views illustrating an environment in a second test step according to an embodiment of the present invention.
Figure 22:
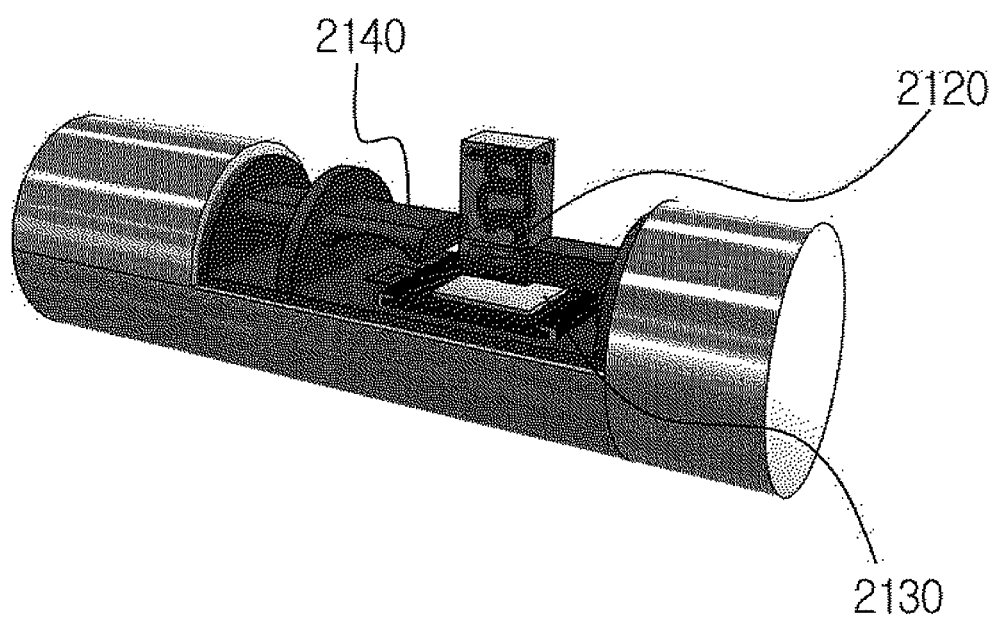

Referring to FIG. 21, the optical sensor array according to an embodiment may be configured as a capsule-type package insertable into a body. Specifically, referring to FIG. 22, a light source or a light reaction area 2120 and an optical sensor array 2130 are configured and tested in an actual packaging environment.

When a luminescence reaction occurs on a surface of an optical sensor, as in an embodiment of the present invention, a cumulative average value of each pixel before the reaction may be obtained in a state in which a corrected value is applied in the first test, a cumulative average value during the reaction of each of the pixels may be obtained, and a difference between the two values may then be output as a final result value.

When a fluorescence reaction or a transmission reaction occurs, as in another embodiment of the present invention, a wavelength or intensity of the light source is controlled for uniformity of the light source.

For example, in one embodiment, for example, when an LED is used as the light source 2120, since efficiency of the LED is affected by temperature, a TEC may be applied to a substrate on which the LED is mounted to maintain a constant temperature in order to adjust temperature uniformity.

In order to implement brightness uniformity of an LED, an APC may be implemented as a feedback circuit in an LED circuit and may control incoming power to achieve a constant brightness.

Specifically, in one embodiment, the light source may be configured by applying a single LED having a specific wavelength or may be configured of a combination of three primary LEDs (red, blue, and green LEDs). Furthermore, the light source may be configured of a combination of a diffuser, a parallel optical lens, or the like forming physical spatial parallel light. A dimmer circuit may be additionally provided to adjust intensity of the light source.

The method may further include aligning an optical axis of light emitted from the light source in addition to setting uniformity of the light source. Specifically, in one embodiment, optical axes of parallel light of the light source may be aligned to be perpendicular to a sensor surface. For example, referring to FIG. 21, a MEMS grating 2140 may be used as a means to determine whether optical axes are aligned.

Referring to FIG. 17, in the second test step (S1620) according to an embodiment, a planarization correction value for planarizing a collected characteristic value of an applied wavelength of an optical sensor array in which a correction reference value of a light source in a packaged application environment is set (S1622) and extracted (S1624), and a linearization correction value for linearizing the collected characteristic value of the optical sensor array relative to the applied intensity band of the light source in the application environment is extracted (S1626).

First, a planarization correction value of the optical sensor array may be obtained for a wavelength of a light source to be used for a bio reaction in an application environment, and stored in a database to form a correction coefficient lookup table.

Next, a linearization correction value of the optical sensor for some sampled steps of an intensity band including intensity of the light source in the application environment may be obtained and stored in a database to form the correction coefficient lookup table.

In one embodiment, the planarization correction value and the linearization correction value may be extracted by applying Equation 4 to some sampled steps.

In the correcting step (S1630), the correction value for the application environment of the optical sensor array is calculated using the first correction value and the second correction value, and the optical sensor array is corrected by applying the correction value thereto. For example, the correction reference value for the application environment of the optical sensor array is set, and, in one embodiment, the planarization correction value and the linearization correction value which are obtained in the first test are multiplied by the planarization correction value and the linearization correction value which are informally obtained in the second test, respectively, to calculate a correction value, and planarization correction and linearization correction of each pixel of the optical sensor array are performed.

Figure 18:
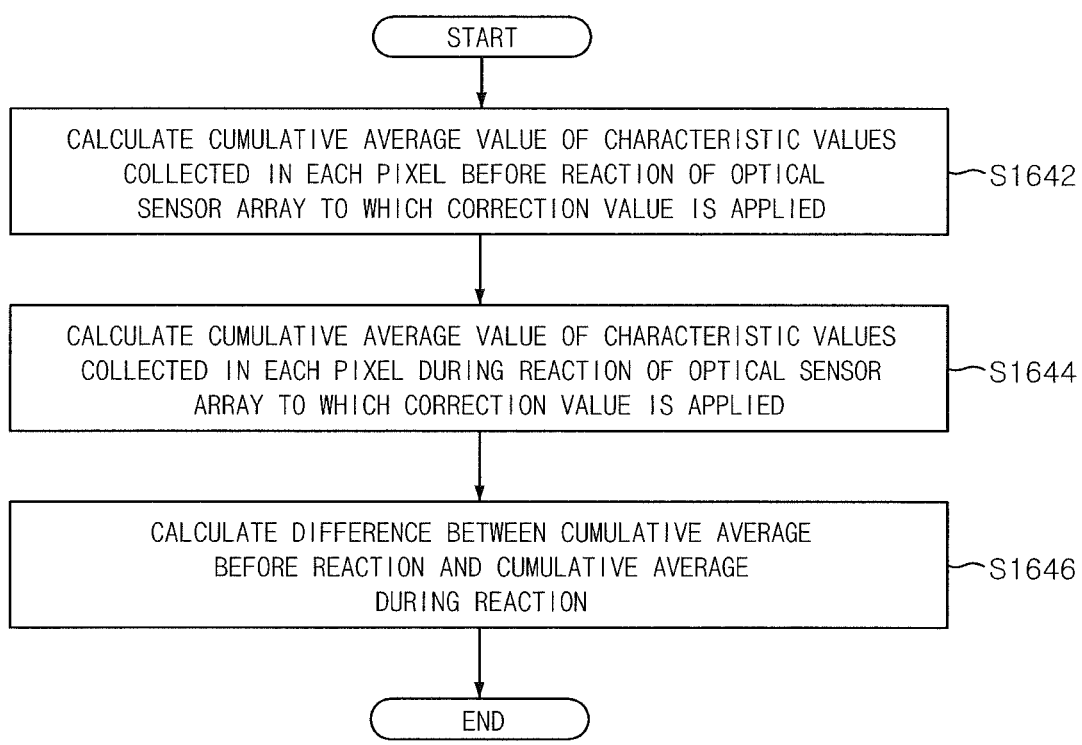
FIG. 18 is a flowchart illustrating a method for diagnosis through a corrected characteristic evaluation of an external lens-free optical sensor pixel array according to an embodiment of the present invention.

In addition, referring to FIG. 18, a final measurement through correction is performed by calculating a cumulative average value of the characteristic values collected in each pixel before the reaction of the optical sensor array to which the correction value is applied (S1642), a cumulative average value of the characteristic values collected in each of the pixels during the reaction is calculated (S1644), and a difference between the cumulative average values is calculated as a final result pixel value (S1646).

In this case, the cumulative average pixel value before the reaction may be extracted through Equation 6.

For example, the cumulative value of the collected pixel values is divided by the number of collection times to calculate a cumulative average value.

$$\begin{pmatrix} MOC_{avg\_bef}(x_1, y_1) & \cdots & MOC_{avg\_bef}(x_i, y_1) \\ \vdots & \ddots & \vdots \\ MOC_{avg\_bef}(x_1, y_j) & \cdots & MOC_{avg\_bef}(x_i, y_j) \end{pmatrix} = \quad \text{[Equation 6]}$$

$$\sum_{n=1}^{N} \begin{pmatrix} MOC_{bef\_n}(x_1, y_1) & \cdots & MOC_{bef\_n}(x_i, y_1) \\ \vdots & \ddots & \vdots \\ MOC_{bef\_n}(x_1, y_j) & \cdots & MOC_{bef\_n}(x_i, y_j) \end{pmatrix} / N$$

Here, $MOC_{bef\_n}(x_i, y_j)$ refers to the output code value which is the characteristic value for the pixel positioned at (i,j) before the reaction. $MOC_{avg\_bef}(x_i, y_j)$ refers to the cumulative average value of the output code value which is the characteristic value for the pixel positioned at (i,j) before the reaction.

Next, the cumulative average pixel value collected during the reaction may be extracted through Equation 7.

$$\begin{pmatrix} MOC_{avg\_dur}(x_1, y_1) & \cdots & MOC_{avg\_dur}(x_i, y_1) \\ \vdots & \ddots & \vdots \\ MOC_{avg\_dur}(x_1, y_j) & \cdots & MOC_{avg\_dur}(x_i, y_j) \end{pmatrix} = \quad \text{[Equation 7]}$$

$$\sum_{n=1}^{N} \begin{pmatrix} MOC_{dur\_n}(x_1, y_1) & \cdots & MOC_{dur\_n}(x_i, y_1) \\ \vdots & \ddots & \vdots \\ MOC_{dur\_n}(x_1, y_j) & \cdots & MOC_{dur\_n}(x_i, y_j) \end{pmatrix} / N$$

Here, $MOC_{bef\_n}(x_i, y_j)$ refers to the output code value which is the characteristic value for the pixel positioned at (i, j) during the reaction. $MOC_{avg\_dur}(x_i, y_j)$ refers to the cumulative average value of the output code value which is the characteristic value for the pixel positioned at (i,j) during the reaction.

A result pixel value $D(x_i, y_i)$ calculated through a difference therebetween may be expressed by Equation 8.

$$\begin{pmatrix} D(x_1, y_1) & \cdots & D(x_i, y_1) \\ \vdots & \ddots & \vdots \\ D(x_1, y_j) & \cdots & D(x_i, y_j) \end{pmatrix} = \quad \text{[Equation 8]}$$

$$\begin{pmatrix} MOC_{avg\_bef}(x_1, y_1) & \cdots & MOC_{avg\_bef}(x_i, y_1) \\ \vdots & \ddots & \vdots \\ MOC_{avg\_bef}(x_1, y_j) & \cdots & MOC_{avg\_bef}(x_i, y_j) \end{pmatrix} -$$

$$\begin{pmatrix} MOC_{avg\_dur}(x_1, y_1) & \cdots & MOC_{avg\_dur}(x_i, y_1) \\ \vdots & \ddots & \vdots \\ MOC_{avg\_dur}(x_1, y_j) & \cdots & MOC_{avg\_dur}(x_i, y_j) \end{pmatrix}$$

Further, in one embodiment, in the second test step (S1620), the characteristic value may also be calculated by implementing an environment that is packaged and used in addition to the packaging environment. For example, when the sensor according to an embodiment is inserted into the human body for measurement of blood glucose in the body, a human body insertion environment may be implemented as an environment in the human body, and accordingly, characteristic measurement may be performed.

Next, a report may be written to include the following information so that users who use the measurement data may determine the extent of an error when reading the data.

First, a report on the test environment specification may include items such as the following Table 2.

TABLE 2

| Test Equipment and Environmental Specification | Value | Tolerance | Min | Typical | Max |
|---|---|---|---|---|---|
| Illumination Type | | | | | |
| Wavelength (λ) of Light Source | [nm] | | | | |
| Two dimensional Uniformity of Light Intensity at each pixel surface | [%] | | | | |
| Uniformity of Light Intensity when time goes on | [%] | | | | |
| Angle of Light Incidence with respect to each pixel surface | [°] | | | | |
| Temperature | [° C.] | | | | |
| Humidity | [% RH] | | | | |
| Analogue Supply Voltage | [DC Volts] | | | | |
| Analogue Supply Current | [mA] | | | | |
| Digital Supply Voltage | [DC Volts] | | | | |
| Digital Supply Current | [mA] | | | | |
| External Clock | [MHz] | | | | |

The specification of the optical sensor array may include the content illustrated in the following Table 3.

TABLE 3

| CMOS Photon Sensor Specification | Value | Tolerance | Min | Typical | Max |
|---|---|---|---|---|---|
| Sensor Maker | | | | | |
| Model Name | | | | | |
| Pixel Size | [um * um] | | | | |
| Resolution | | | | | |
| ADC | [bit] | | | | |
| Sensitivity | | | | | |
| Dynamic Range | | | | | |

The lookup table of the correction value may include the content illustrated in the following Table 4.

TABLE 4

| Code/(# of Photon) | Calibrated Output Code value | Measured Output Code Value Average | Planarization Calibration Coefficient | Linearity Calibration Coefficient |
|---|---|---|---|---|
| 1/( ) | | | | |
| ... | ... | ... | ... | ... |
| 100/( ) | | | | |
| ... | ... | ... | ... | ... |
| 200/( ) | | | | |
| ... | ... | ... | ... | ... |
| 255/( ) | | | | |
| ... | ... | ... | ... | ... |

As described above, according to the present invention, test and correction references for securing measurement reliability of an optical sensor array applied to various environments may be provided, and a reliability range of the measurement value may be found, and thus potential determination errors may be reduced when a user in an actual application such as the bio/medical field and the like finally makes a decision.

Since the optical sensor may be implemented without an additional external lens module configuration, the configuration of the optical sensor may be further simplified, and the optical sensor contributes to the activation of industrial fields such as the ultra-small, high-performance lab-on-a-chip field or the diagnostic type implantable patch field.

According to the present invention, measurement and correction references for securing measurement reliability of the optical sensor array applied to various environments may be provided and a reliability range of the measurement value may be found. Therefore, a user engaged in the actual bio/medical field can recognize an error range of measurement result values, the number of errors in an important determination can be reduced, and reliability can be increased.

In addition, since an optical sensor can be implemented without an additional external lens module configuration, the configuration of the optical sensor can be further simplified, and the optical sensor can contribute to the activation of industrial fields such as the ultra-small, high-performance lab-on-a-chip field or the diagnostic type implantable patch field.

While the present invention has been particularly described with reference to exemplary embodiments, it should be understood by those skilled in the art that various changes in form and details may be made without departing from the spirit and scope of the present invention.

Therefore, the exemplary embodiments and the accompanying drawings should be considered in a descriptive sense only and not for purposes of limitation. The scope of the invention is not defined by the detailed description of the invention but by the appended claims, and encompasses all modifications and equivalents that fall within the scope of the appended claims.

What is claimed is:

1. A method for correcting an optical sensor array through characteristic evaluation, the method comprising:
   setting at least one of an exposure time, an analog gain, a digital gain and a frame rate of the optical sensor array to be a default value;
   statistically measuring a collection characteristic of the optical sensor array with the default value, according to a wavelength or an intensity of a standard light source having a predetermined characteristic value;
   calculating a planarization calibration value for planarizing a collection characteristic value of the optical sensor array according to a wavelength change of the standard light source;
   calculating a linearity calibration value for linearizing a collection characteristic value of the optical sensor array according to the intensity of the standard light source; and
   performing a planarization calibration and a linearity calibration on the collection characteristics of each pixel of the optical sensor array using the planarization calibration value and the linearity calibration value.

2. The method of claim 1, wherein the planarization calibration value or the linearity calibration value is calculated as a matrix value.

3. The method of claim 1, wherein the statistically measuring the collection characteristic of the optical sensor array comprises measuring N times according to the set frame rate and calculating a difference between measurement values in consecutive frames among a series of the measurement values which are measured N times.

4. The method of claim 3, wherein the statistically measuring the collection characteristic of the optical sensor array comprises calculating a difference between a measurement value of a dark frame measured without the standard light source and measurement values among the series of the measurement values which are measured N times using the measurement value of the dark frame as a reference offset value.

5. The method of claim 3, wherein the calculating the planarization calibration value comprises determining a pixel having the highest density of the measurement values which are measured N times among all of the pixels of the optical sensor array to a reference pixel for the planarization calibration and calculating the planarization calibration value using the reference pixel for the planarization calibration.

6. The method of claim 5, wherein the calculating the planarization calibration value comprises setting one of an average value, an intermediate value or a mode value of the reference pixel for the planarization calibration to a reference value of the planarization calibration.

7. The method of claim 1, wherein a light intensity measurement effective range in which the measurement values linearly increase according to the intensity change of the light source with respect to at least one pixel of the optical sensor array is set.

8. The method of claim 1, wherein the statistically measuring the collection characteristic of the optical sensor array comprises extracting a representative value of each pixel of the optical sensor array, wherein the planarization calibration value or the linearity calibration value is calculated as a calibration value for the representative value.

9. The method of claim 1, wherein the statistically measuring the collection characteristic of the optical sensor array comprises receiving a sensitivity measurement value of a calibrated photodiode with respect to the standard light source and comparing the statistical characteristics of the sensitivity measurement values and the statistical characteristics of the optical sensor array to extract the representative value.

* * * * *